(12) United States Patent
Wongsenakhum et al.

(10) Patent No.: US 10,113,232 B2
(45) Date of Patent: Oct. 30, 2018

(54) AZIMUTHAL MIXER

(71) Applicant: Lam Research Corporation, Fremont, CA (US)

(72) Inventors: Panya Wongsenakhum, Santa Clara, CA (US); Mohamed Shihaam Suhail, Santa Clara, CA (US); Ravi Bharatkumar Parmar, San Jose, CA (US); David G. Cohen, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 294 days.

(21) Appl. No.: 14/802,920

(22) Filed: Jul. 17, 2015

(65) Prior Publication Data
US 2016/0032456 A1    Feb. 4, 2016

Related U.S. Application Data

(60) Provisional application No. 62/031,769, filed on Jul. 31, 2014.

(51) Int. Cl.
*C23C 16/455* (2006.01)

(52) U.S. Cl.
CPC .. *C23C 16/45565* (2013.01); *C23C 16/45512* (2013.01)

(58) Field of Classification Search
CPC .............. C23C 16/45565; C23C 16/45512
USPC ................................ 118/715; 156/345.33
See application file for complete search history.

(56) References Cited

U.S. PATENT DOCUMENTS

| | | | |
|---|---|---|---|
| 5,792,272 A * | 8/1998 | van Os | C23C 16/4405 118/723 I |
| 5,846,330 A | 12/1998 | Quirk et al. | |
| 5,851,294 A | 12/1998 | Young et al. | |
| 5,951,771 A | 9/1999 | Raney et al. | |
| 5,976,261 A | 11/1999 | Moslehi et al. | |
| 6,036,783 A | 3/2000 | Fukunaga et al. | |
| 6,143,078 A | 11/2000 | Ishikawa et al. | |
| 6,178,918 B1 * | 1/2001 | van Os | C23C 16/4405 118/715 |
| 6,270,862 B1 | 8/2001 | McMillin et al. | |
| 6,375,750 B1 * | 4/2002 | van Os | C23C 16/4405 118/500 |
| 6,432,831 B2 | 8/2002 | Dhindsa et al. | |
| 6,486,081 B1 | 11/2002 | Ishikawa et al. | |
| 6,884,296 B2 | 4/2005 | Basceri et al. | |
| 7,017,514 B1 * | 3/2006 | Shepherd, Jr. | C23C 16/452 118/723 ME |

(Continued)

OTHER PUBLICATIONS

U.S. Restriction Requirement dated Jan. 18, 2017, issued in U.S. Appl. No. 14/566,523.

(Continued)

*Primary Examiner* — Rudy Zervigon
(74) *Attorney, Agent, or Firm* — Weaver Austin Villeneuve & Sampson LLP

(57) ABSTRACT

An azimuthal mixer component that may be plumbed in-line with a showerhead stem tube of a semiconductor processing apparatus is provided. The azimuthal mixer may include a main passage that is coaxial with the stem tube, and one or more plenums that partially or wholly encircle the main passage. Corresponding sets of radial passages may fluidically connect the main passage with each of the plenums.

21 Claims, 18 Drawing Sheets

(56) References Cited

U.S. PATENT DOCUMENTS

| | | |
|---|---|---|
| 7,303,141 B2 | 12/2007 | Han et al. |
| 7,780,789 B2 | 8/2010 | Wu et al. |
| 7,806,078 B2 | 10/2010 | Yoshida |
| 9,175,394 B2 | 11/2015 | Yudovsky et al. |
| 9,362,137 B2 | 6/2016 | Kang et al. |
| 9,574,268 B1 | 2/2017 | Dunn et al. |
| 9,951,421 B2 | 4/2018 | Lind |
| 2002/0195124 A1 | 12/2002 | Chin et al. |
| 2003/0019428 A1 | 1/2003 | Ku et al. |
| 2003/0070620 A1 | 4/2003 | Cooperberg et al. |
| 2004/0028810 A1 | 2/2004 | Grant et al. |
| 2004/0035358 A1 | 2/2004 | Basceri et al. |
| 2007/0062646 A1 | 3/2007 | Ogawa et al. |
| 2008/0102203 A1 | 5/2008 | Wu et al. |
| 2008/0102208 A1 | 5/2008 | Wu et al. |
| 2011/0098841 A1 | 4/2011 | Tsuda |
| 2016/0168705 A1 | 6/2016 | Lind |

OTHER PUBLICATIONS

U.S. Office Action dated Apr. 16, 2017, issued in U.S. Appl. No. 14/566,523.

U.S. Final Office Action dated Aug. 3, 2017, issued in U.S. Appl. No. 14/566,523.

* cited by examiner

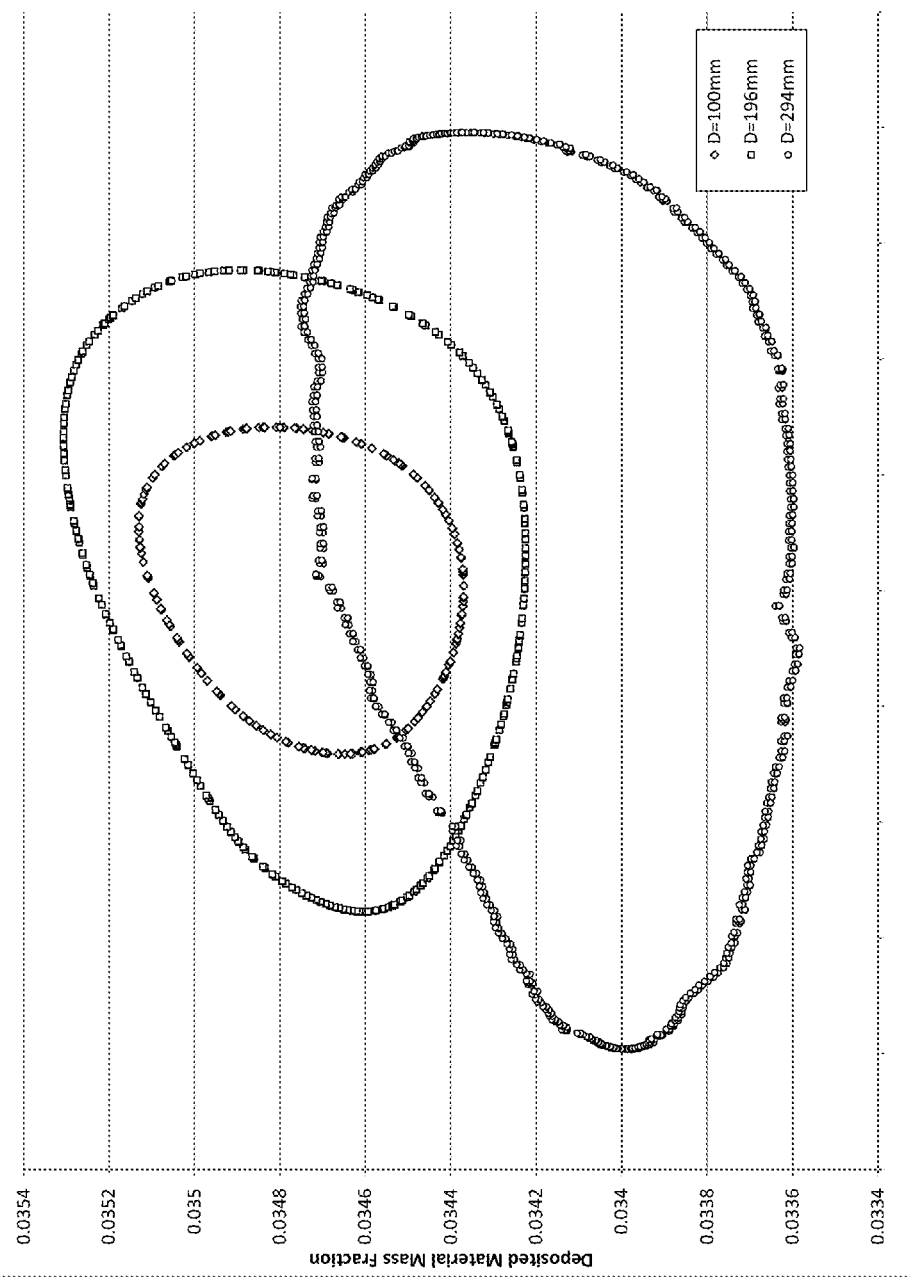

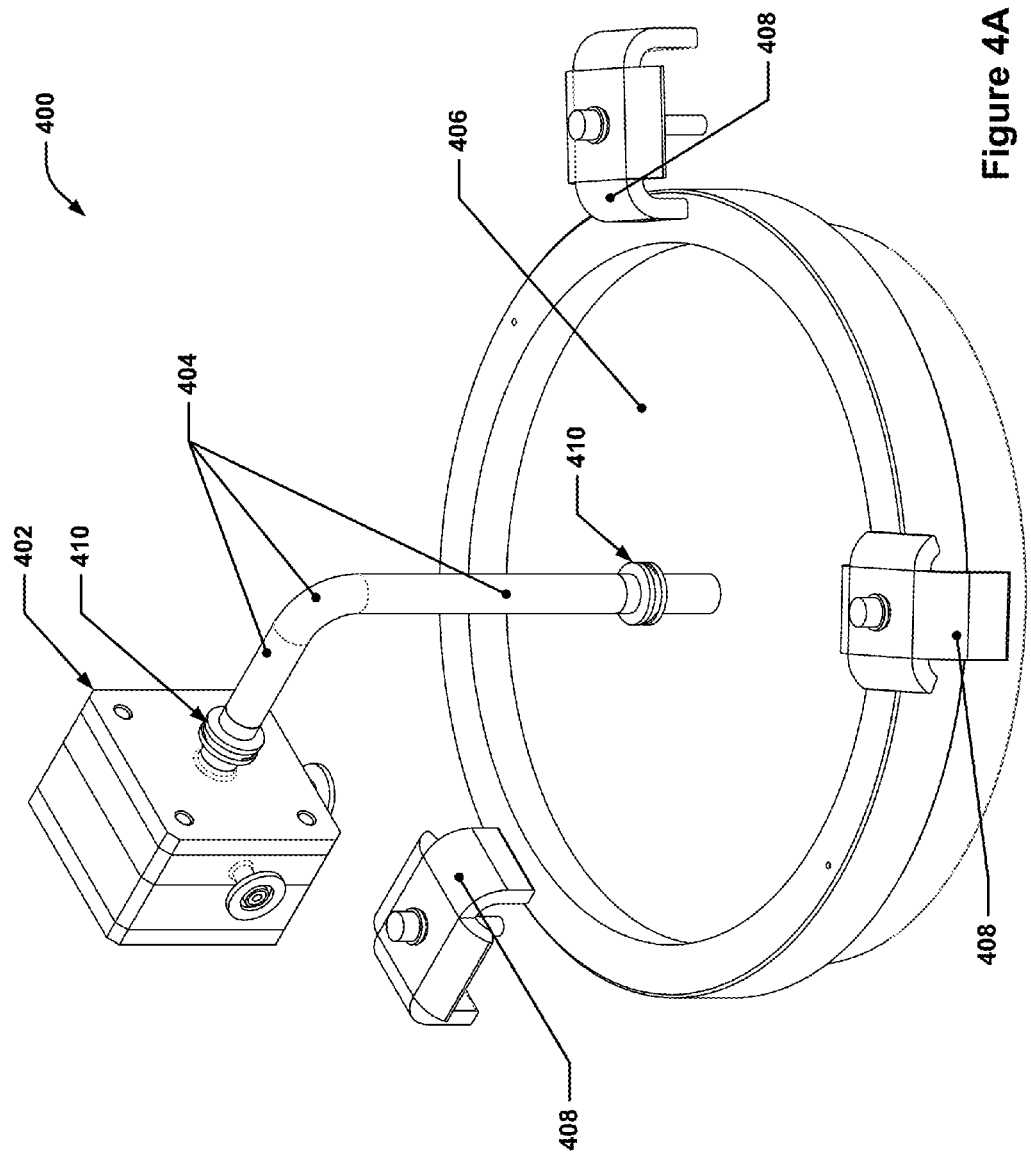

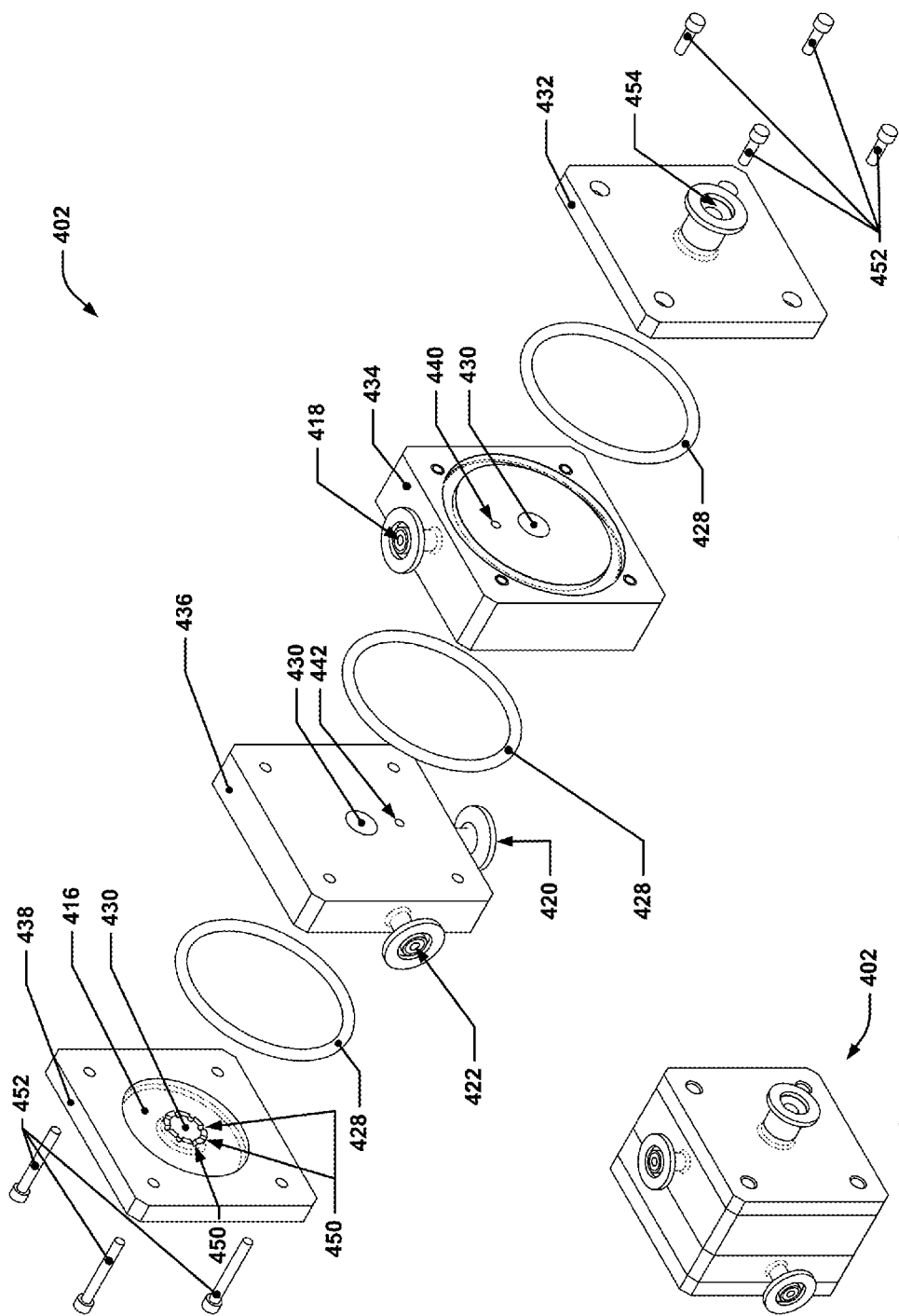

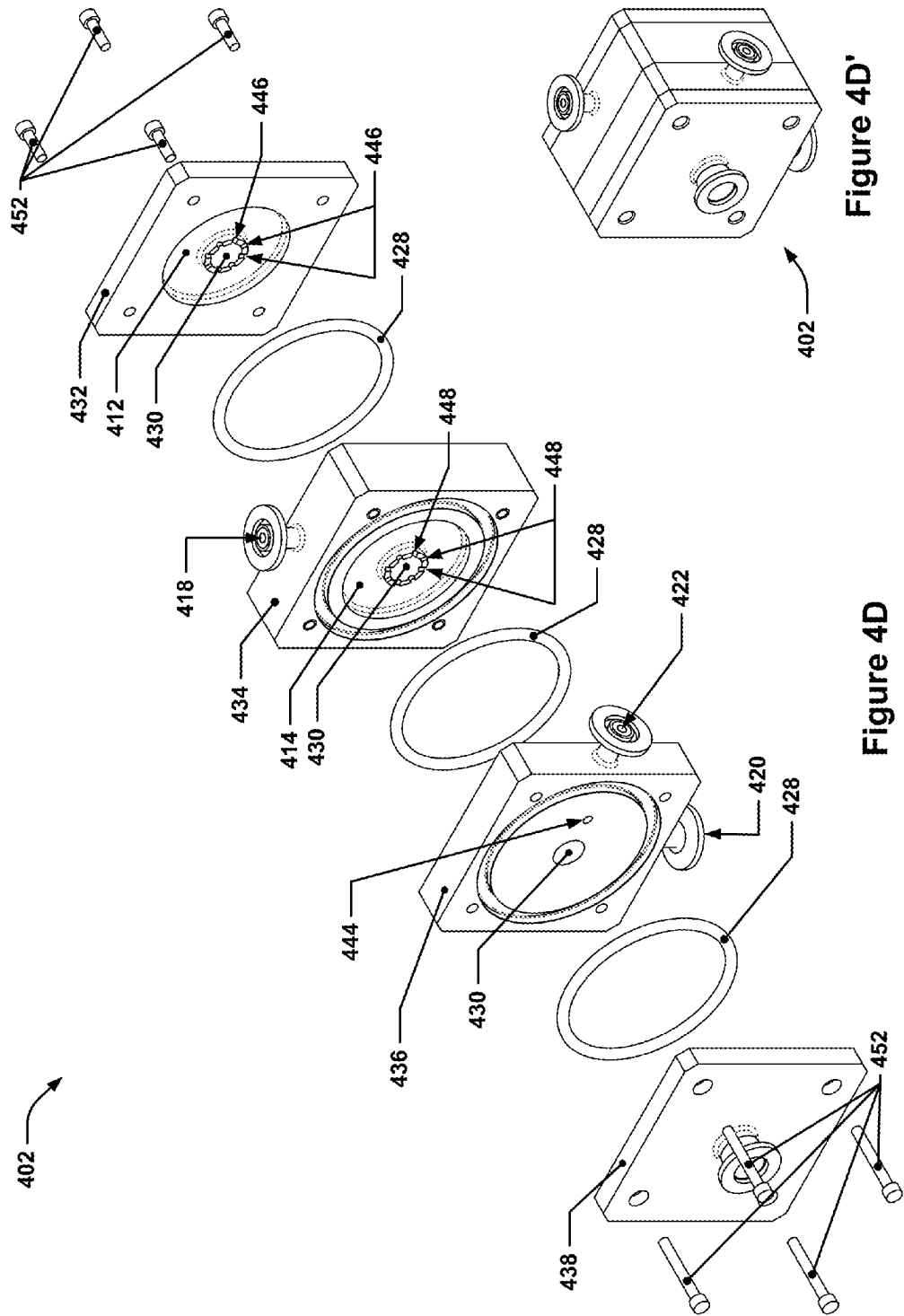

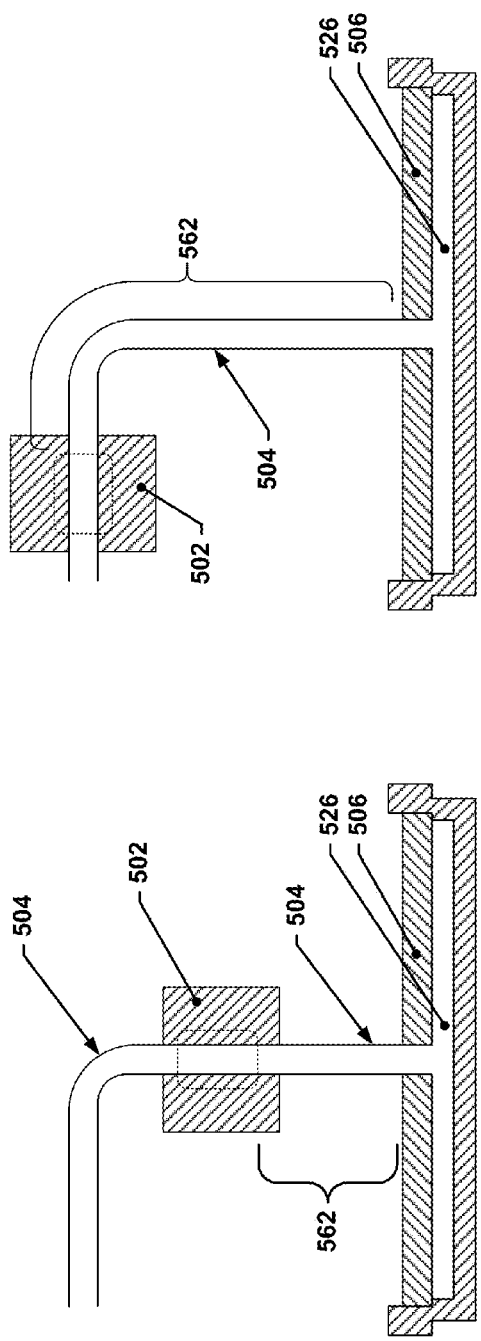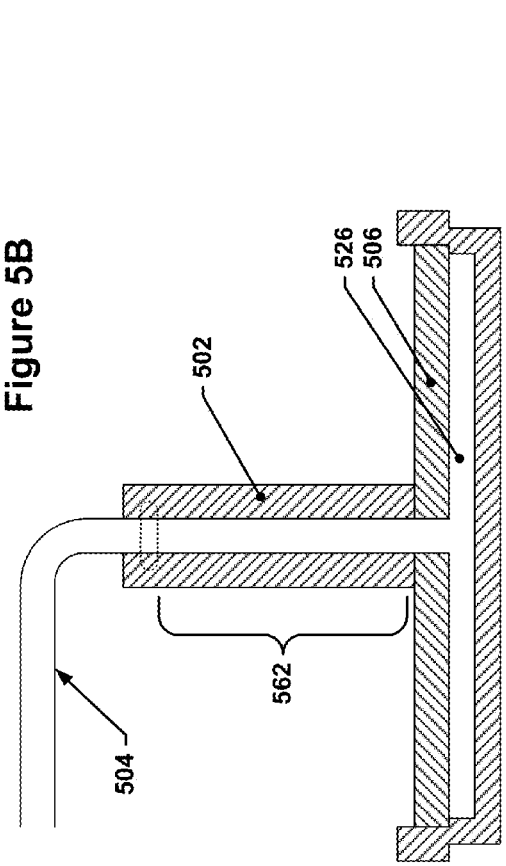

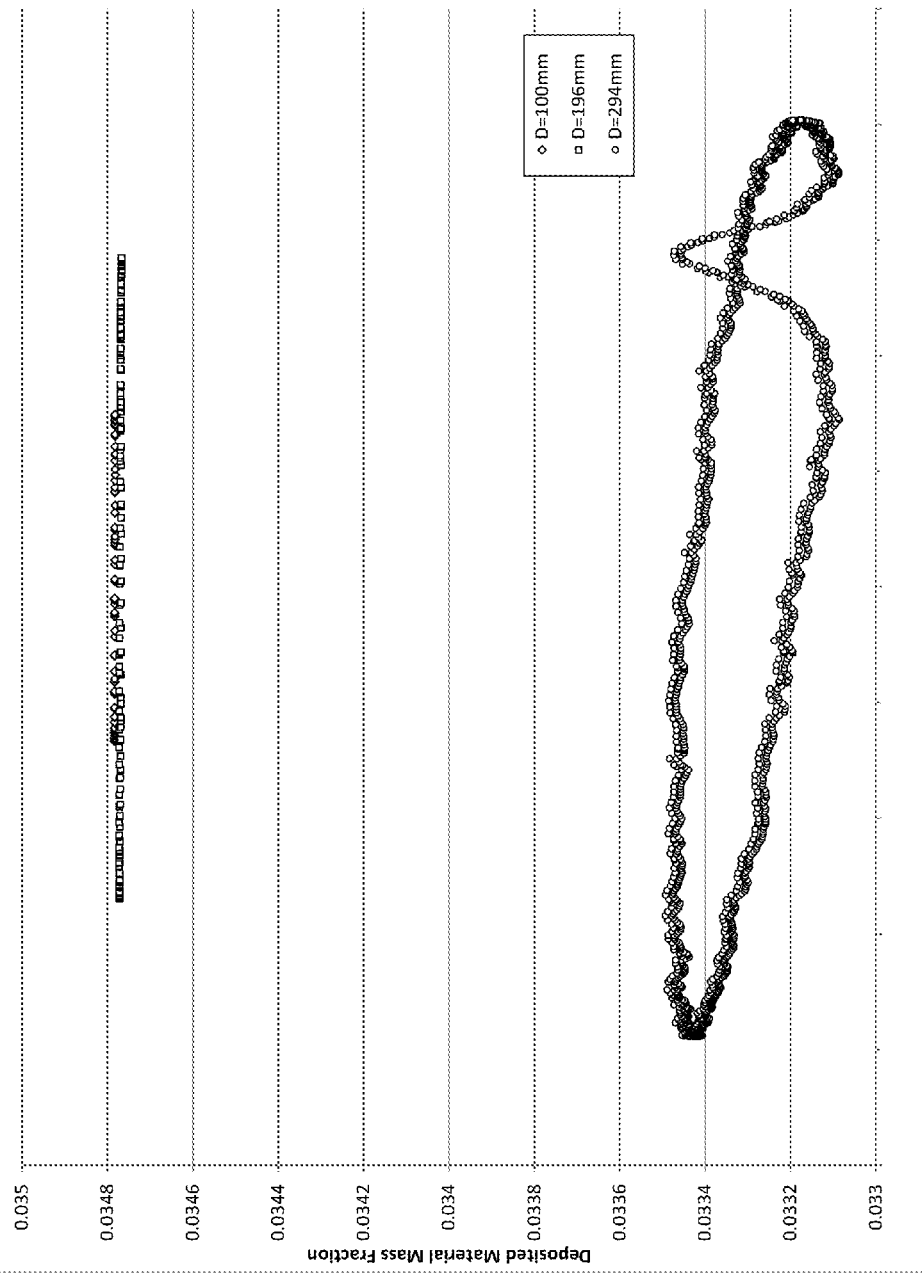

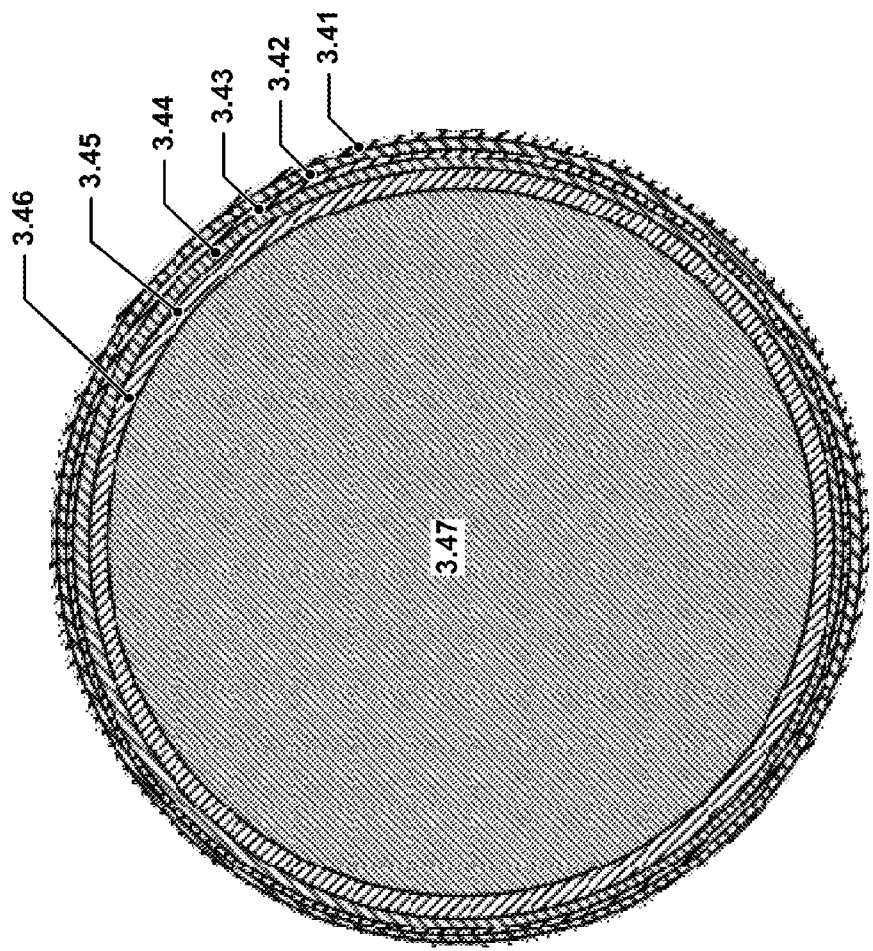
Figure 7: Deposition on Wafer at Wafer Scan Locations

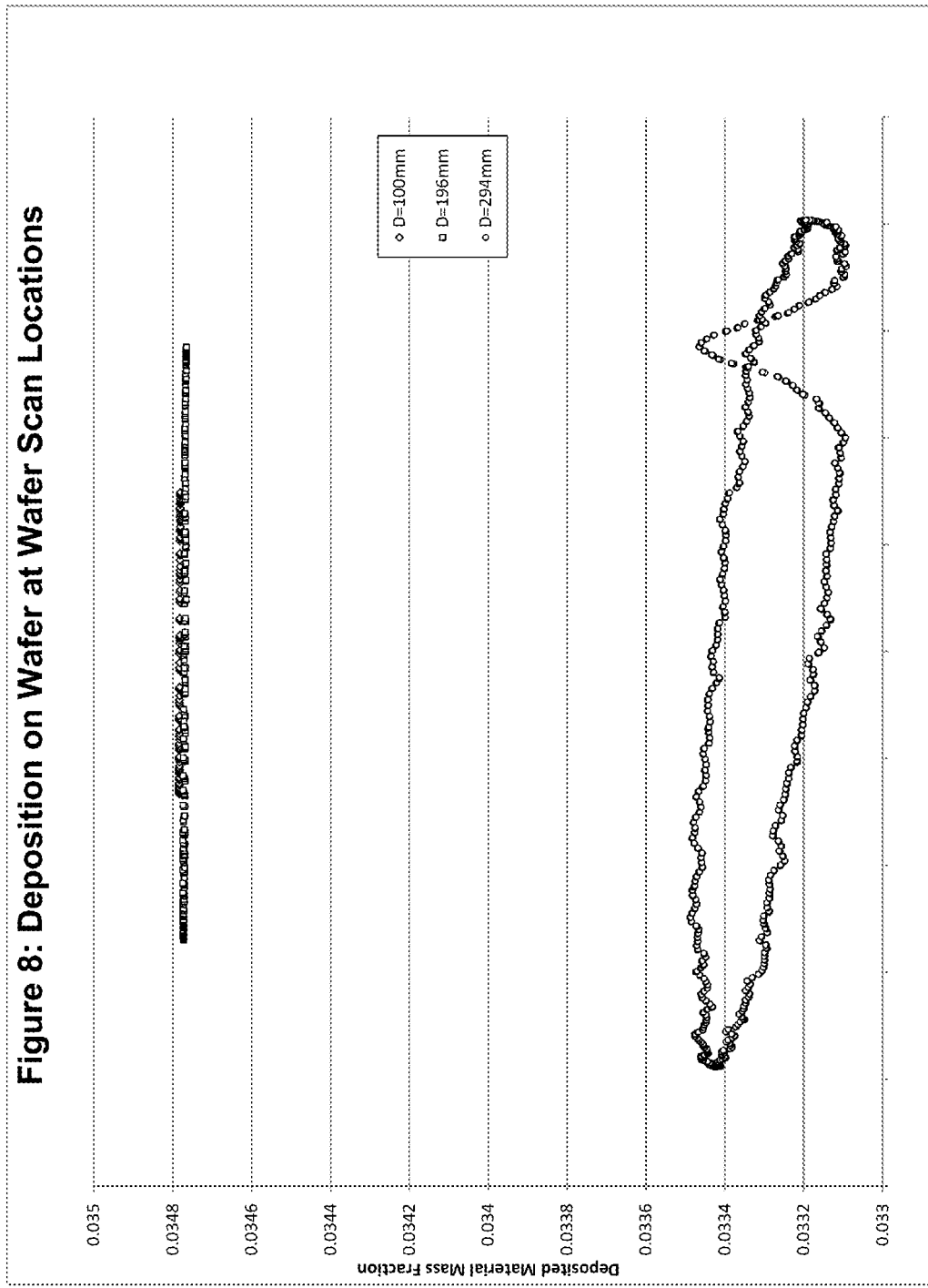

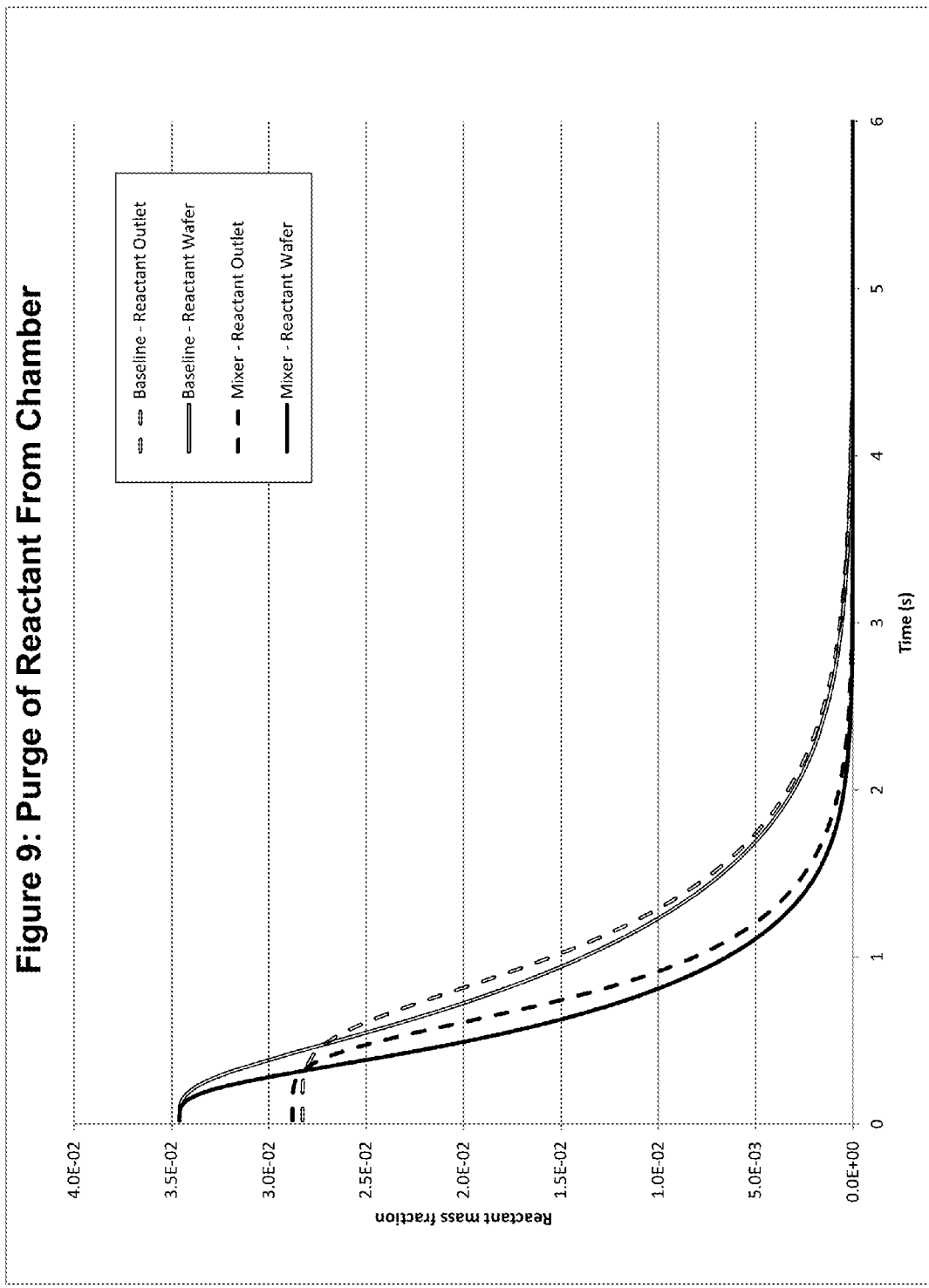

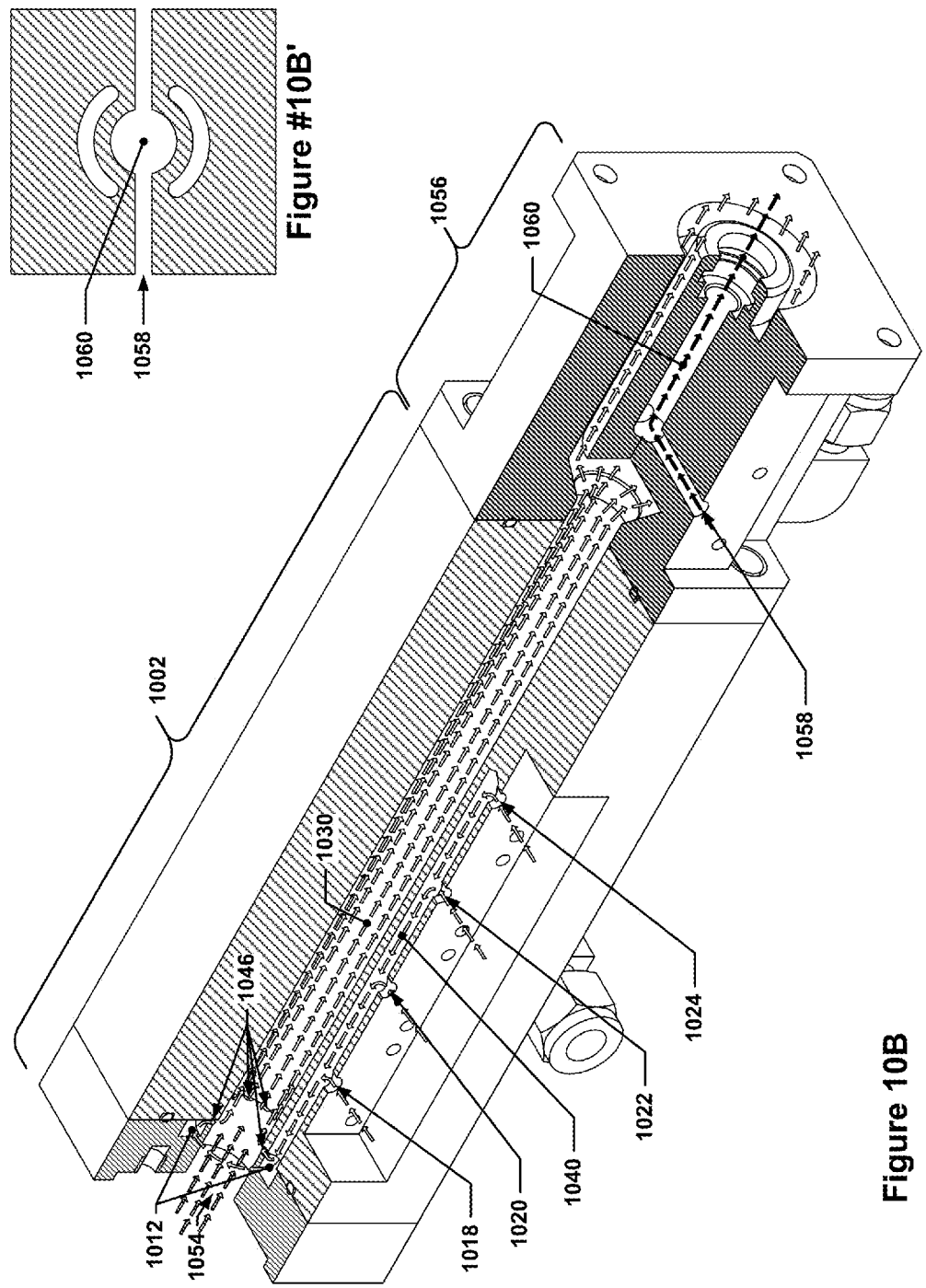

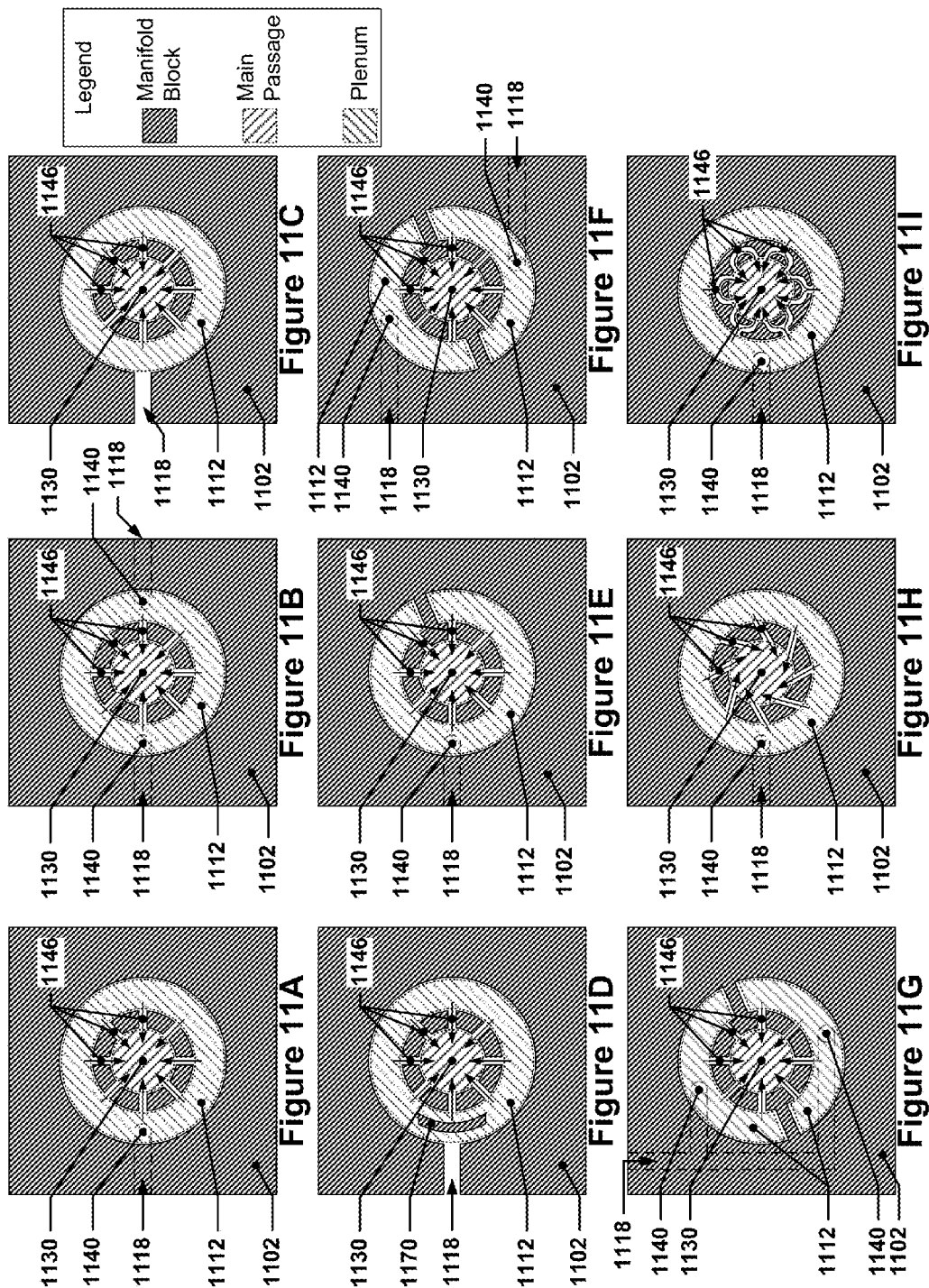

AZIMUTHAL MIXER

CROSS REFERENCE TO RELATED APPLICATIONS

This is a non-provisional application that claims benefit of U.S. Provisional Patent Application Ser. No. 62/031,769 filed Jul. 31, 2014, which is hereby incorporated by reference in its entirety and for all purposes.

BACKGROUND

Many semiconductor manufacturing processes involve the use of a gas distribution system that distributes process gases across the surface of a semiconductor wafer during semiconductor processing operations using a "showerhead." The showerhead is typically the same diameter, or a slightly larger diameter, as the wafer being processed and includes one or more internal plenums and a large number of small ports that are located on the side of the showerhead facing the wafer and that lead to the internal plenum. Gas that is introduced into the internal plenums of the showerhead flows out of the internal plenums via the small ports and is thus distributed across the semiconductor wafer. The gas is typically introduced to the showerhead's internal plenums by a stem tube that is connected to one or more process gas sources.

SUMMARY

In some implementations, an apparatus for supplying process gases to a semiconductor processing gas distribution system may be provided. The apparatus may include a main passage, a first plenum that substantially encircles the main passage, a first inlet, and a plurality of first radial passages. The first inlet may be fluidically connected to the first plenum and each first radial passage may span between, and fluidically connect, the main passage with the first plenum.

In some implementations, the first plenum may be annular in shape and have a center axis that is coaxial with the main passage.

In some implementations, there may be three first radial passages, although in other implementations, there may be four or more first radial passages.

In some implementations, the plurality of first radial passages may be distributed around the main passage in a substantially equally-spaced manner.

In some other or alternative such implementations, the apparatus may further include a manifold block that includes the main passage, the first plenum, the first inlet, and the plurality of first radial passages. In such implementations, the apparatus may also include a gas distribution showerhead and a stem tube and the stem tube may be interposed between the manifold block and the gas distribution showerhead.

In some implementations of the apparatus, the apparatus may further include a manifold block that includes the main passage, the first plenum, the first inlet, and the plurality of first radial passages, as well as a gas distribution showerhead and a stem tube. The stem tube may include a first portion and a second portion, the manifold block may be located between the first portion and the second portion, a first end of the first portion may be mated and fluidically connected with a first end of the main passage, a first end of the second portion may be mated and fluidically connected with a second end of the main passage opposite the first end of the main passage, and a second end of the second portion may be configured to be connected with a gas distribution showerhead.

In some such implementations, the first portion may include a 90-degree bend and the main passage and the second portion may be substantially coaxial with one another. In some other such implementations, the second portion may include a 90-degree bend and the main passage and the first portion may be substantially coaxial with one another.

In some implementations of the apparatus, the apparatus may further include a second plenum that substantially encircles the main passage, a second inlet that is fluidically connected to the second plenum, and a plurality of second radial passages, each second radial passage spanning between, and fluidically connecting, the main passage with the second plenum.

In some such implementations of the apparatus, the apparatus may further include a third plenum that substantially encircles the main passage, a third inlet that is fluidically connected to the third plenum, and a plurality of third radial passages, each third radial passage spanning between, and fluidically connecting, the main passage with the third plenum.

In some implementations of the apparatus, the sum of the cross-sectional areas of the first radial passages may be less than one tenth the total cross-sectional area of the first plenum, the cross-sectional area of each first radial passage may be evaluated with respect to a plane that is normal to the radial direction along which that first radial passage travels, and the total cross-sectional area of the first plenum may be evaluated with respect to a plane that intersects, and is parallel to, a center axis of the main passage and includes portions of the first plenum on both sides of the main passage.

In some implementations of the apparatus, the apparatus may further include a manifold block including a first block and a second block. In such implementations, the first block and the second block may be adjacent to one another, the first radial passages may be defined by opposing surfaces of the first block and the second block, the first plenum may be defined by opposing surfaces of the first block and the second block, and a first feed-through may fluidically connect the first inlet with the first plenum.

In some such implementations of the apparatus, the apparatus may include one or more additional inlets and each additional inlet may be fluidically connected with the first feed-through prior to the first feed-through reaching the first plenum. In some further such implementations, the first inlet and the one or more additional inlets may be arranged in a line parallel to the main passage and the first feed-through may be parallel to the main passage.

In some additional such implementations, the first inlet and the one or more additional inlets may be located between the first plenum and the end of the main passage that serves as an outlet from the apparatus when the apparatus is installed as part of the semiconductor processing gas distribution system.

In some additional implementations, the apparatus may further include a manifold block that includes the first plenum, the first feed-through, the first inlets, the one or more additional inlets, and the main passage, as well as a heater mechanism in thermal contact with the manifold block along at least one side of the manifold block other than a side of the manifold block where the first inlet and the one or more additional inlets enter the manifold block. In some such implementations, the heater mechanism may include a serpentine heating fluid flow passage.

In some implementations, the manifold block may be approximately 7 to 9 inches in length in a direction parallel to the main passage and 2 to 3 inches square in directions perpendicular to an axis parallel to the main passage, and the main passage is approximately 0.375" to 0.75" in diameter.

In some implementations, each first radial passage may have a cross-sectional area in a plane that is normal to the radial direction along which that first radial passage travels that is between 0.0025 in$^2$ and 0.057 in$^2$ and the first plenum may have a total cross-sectional area with respect to a plane that intersects, and is parallel to, a center axis of the main passage that is between 0.21 in$^2$ and 0.47 in$^2$.

In some additional such implementations, the apparatus may further include a coaxial manifold body that may, in turn, include a coaxial inlet, a coaxial passage, and a main passage extension. In such implementations, the coaxial inlet may be fluidically connected with the coaxial passage within the coaxial manifold body, the coaxial inlet and the coaxial passage may be fluidically isolated from the main passage extension within the coaxial manifold body, and the main passage extension may be formed, at least in part, by one or more fluid flow volumes that are interposed between the coaxial passage and the outer surfaces of the coaxial manifold body.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

These and other aspects of the present invention are described and illustrated with reference to several embodiments herein.

BRIEF DESCRIPTION OF THE DRAWINGS

FIG. 1' is an isometric view of the example gas distribution system of FIG. 1.

FIG. 3 is a plot showing the estimated mass fraction of process gas delivered to the wafer measured around the wafer at three different diameters resulting from a simulated deposition operation using the example gas distribution system of FIG. 1.

FIG. 4A is an isometric view of an example gas distribution system for a semiconductor processing apparatus featuring an azimuthal mixer.

FIG. 4C is an exploded isometric view of the manifold block incorporating an azimuthal mixer of FIGS. 4A and 4B.

FIG. 4C' is an unexploded isometric view of the manifold block of FIG. 4C.

FIG. 4D is an exploded reverse isometric view of the manifold block of FIG. 4C.

FIG. 4D' is an unexploded isometric view of the manifold block of FIG. 4D.

FIG. 5A is a schematic of one potential placement of a manifold block relative to a showerhead and stem tube.

FIG. 5B is a schematic of another potential placement of a manifold block relative to a showerhead and stem tube.

FIG. 5C is a schematic of a potential placement of another example manifold block relative to a showerhead and stem tube.

FIG. 6 is a plot showing the mass fraction of a process gas on a wafer at three different diameters resulting from a simulated deposition operation using the manifold block of FIGS. 4C through 4D placed at a location such as that depicted in FIG. 5B.

FIG. 7 is a contour plot showing the mass fraction of process gas delivered to the wafer resulting from a simulated deposition operation using the manifold block of FIGS. 4C through 4D placed at a location such as that depicted in FIG. 5B.

FIG. 8 is a plot showing the mass fraction of process gas delivered to the wafer at three different diameters resulting from a simulated deposition operation using the manifold block of FIGS. 4C through 4D placed at a location such as that depicted in FIG. 5A.

FIG. 9 is a plot showing improvements in purge time using an azimuthal mixer as discussed herein in comparison to a stem tube arrangement without an azimuthal mixer.

FIG. 10B is an isometric cutaway view of the azimuthal mixer of FIG. 10A.

FIG. 10B' depicts a schematic cross-section of a coaxial manifold body in a plane that intersects the coaxial inlet and is perpendicular to the center axis of the coaxial passage.

FIGS. 11A through 11I depict cross-sections through various different configurations of plenums, radial passages, and main passages.

FIGS. 1, 4A through 4D, and 10A through 10D (excepting FIG. 10B') are drawn to-scale within each Figure, although the scale from Figure to Figure may differ.

DETAILED DESCRIPTION

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

Wafer uniformity is an important factor in the processing of high quality semiconductor wafers. A variety of factors during wafer processing may affect wafer uniformity, including gas distribution uniformity across the wafer, temperature distribution across the wafer, pressure imbalances across the wafer, plasma density (if plasma is used) distribution, the presence of particulates, etc. Considerable effort has been expended by a variety of semiconductor equipment manufacturers, including the assignee of the present application, in designing gas distribution system showerheads that distribute gas from one or more inlets in a more uniform manner across the surface of a processed wafer.

It is to be understood that, as used herein, the term "semiconductor wafer" may refer both to wafers that are made of a semiconductor material, e.g., silicon, and wafers that are made of materials that are not generally identified as semiconductors, e.g., epoxy, but that typically have semiconductor materials deposited on them during a semiconductor processing. The apparatuses and methods described in this disclosure may be used in the processing of semiconductor wafers of multiple sizes, including, but not limited to, 200 mm, 300 mm, and 450 mm diameter semiconductor wafers.

Showerheads are typically engineered to be axially-symmetric and usually have a center-mounted inlet where process gases are introduced into the internal plenum of the showerhead. In some designs, a showerhead may have multiple internal plenums, each fed by a different inlet—in such designs, it is still common to center the inlets on the showerhead center axis, e.g., by using a coaxial feed arrangement for the inlets.

The present inventors have realized that regardless of how well-engineered a showerhead is in terms of providing for uniform gas distribution, such showerheads may still produce unacceptable non-uniformity in layer thickness due to non-uniformities in gas distribution at the inlets to the showerhead.

Figure 1:
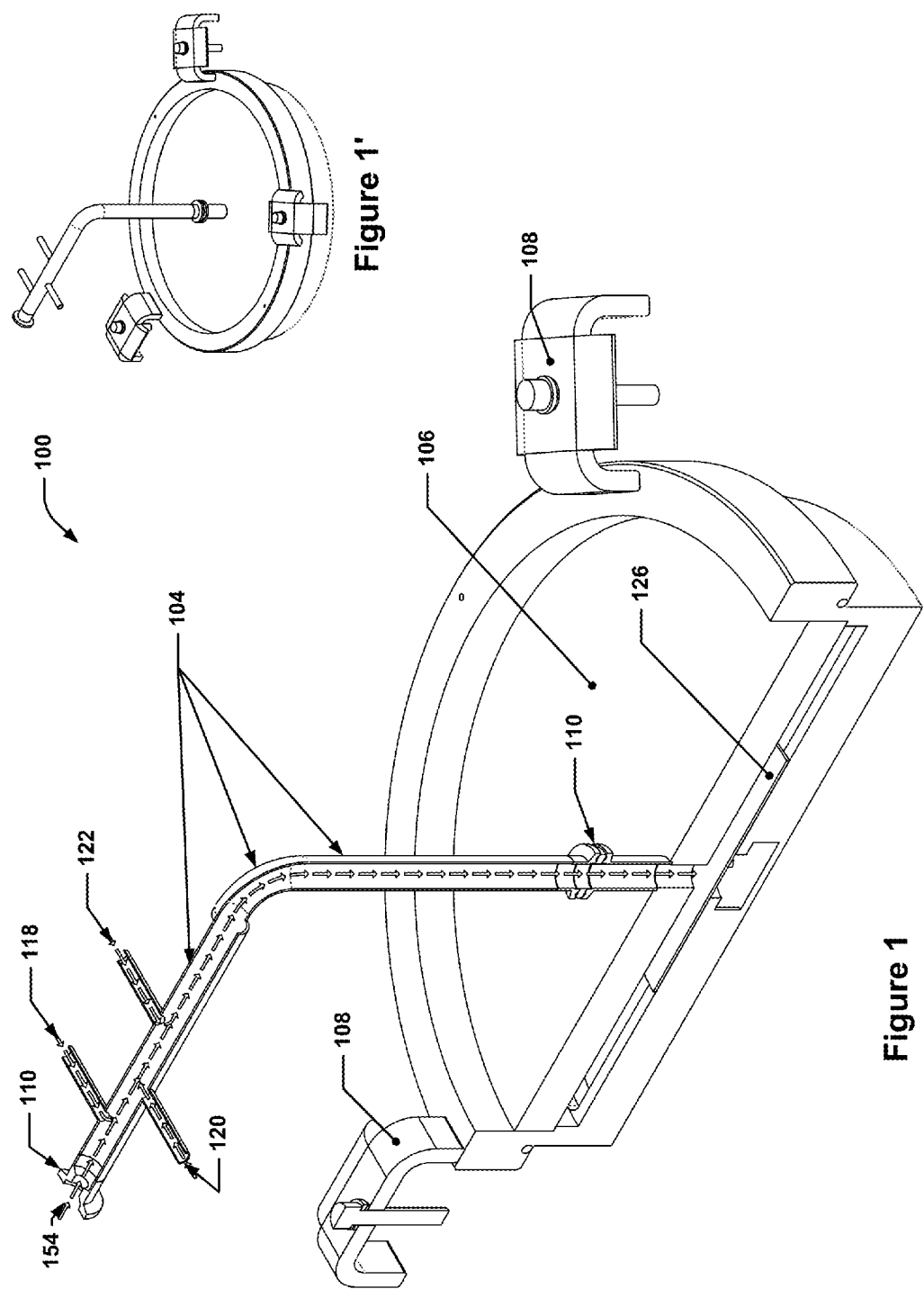
FIG. 1 is a cutaway isometric view of an example gas distribution system for a semiconductor processing apparatus.

The present inventors arrived at such realization after examining an example gas distribution system such as that shown in FIG. 1. FIG. 1 is a cutaway isometric view of an example gas distribution system for a semiconductor processing apparatus. FIG. 1' is an isometric view of the example gas distribution system of FIG. 1.

As can be seen, the gas distribution system 100 includes several components, including a showerhead 106, which may serve as a lid to a process chamber (not shown). The showerhead 106, in this case, may be held in place on the process chamber using a number of clamps 108. A stem tube 104 may be used to supply process gases to a showerhead plenum 126; the stem tube 104 may be coupled to the showerhead 106 and to a gas source (not shown) via couplers 110 (only the flange features and seals that are part of couplers 110 are shown; the flanges may be compressed by a split collar clamp (not shown) with an internal tapered circumferential groove that may be latched around the flanges; of course, other types of couplers may be used as well, or, in some cases, the couplers may be omitted and the stem tube 104 may be permanently affixed to the showerhead 106 and to other components using welded, brazed, etc. connections).

As can be seen, the stem tube 104 has three inlets: a first inlet 118, a second inlet 120, and a third inlet 122. In addition to these three inlets, the stem tube 104 also has a stem feed inlet 154. During semiconductor processing operations, different gases and mixtures of gases may be flowed through some or all of these inlets at different rates. For example, in a process that the present inventors investigated, 1500 sccm of Ar was flowed through the stem feed inlet 154, 4750 sccm of H2 was flowed through the first inlet 118, 2250 sccm of Ar was flowed through the second inlet 120, and 3400 sccm of Ar and 450 sccm of a reactant were flowed through the third inlet 122.

The present inventors realized that the introduction of high-molecular weight gases such as Ar from the side-mounted inlets, e.g., the first inlet 118, the second inlet 120, and/or the third inlet 122, was forcing light molecular weight gases, such as H2 and the reactant gas, to one side of the stem tube. The present inventors further realized that while diffusion would, over time, cause such an azimuthally-lopsided gas distribution to eventually become evenly distributed within the stem tube 104, the stem tube 104 would need to be lengthened considerably, which was undesirable from both a packaging perspective and from a performance perspective (the longer the stem tube 104 is, the more gas must be flowed through it in order to deliver gases to the showerhead).

Figure 2:
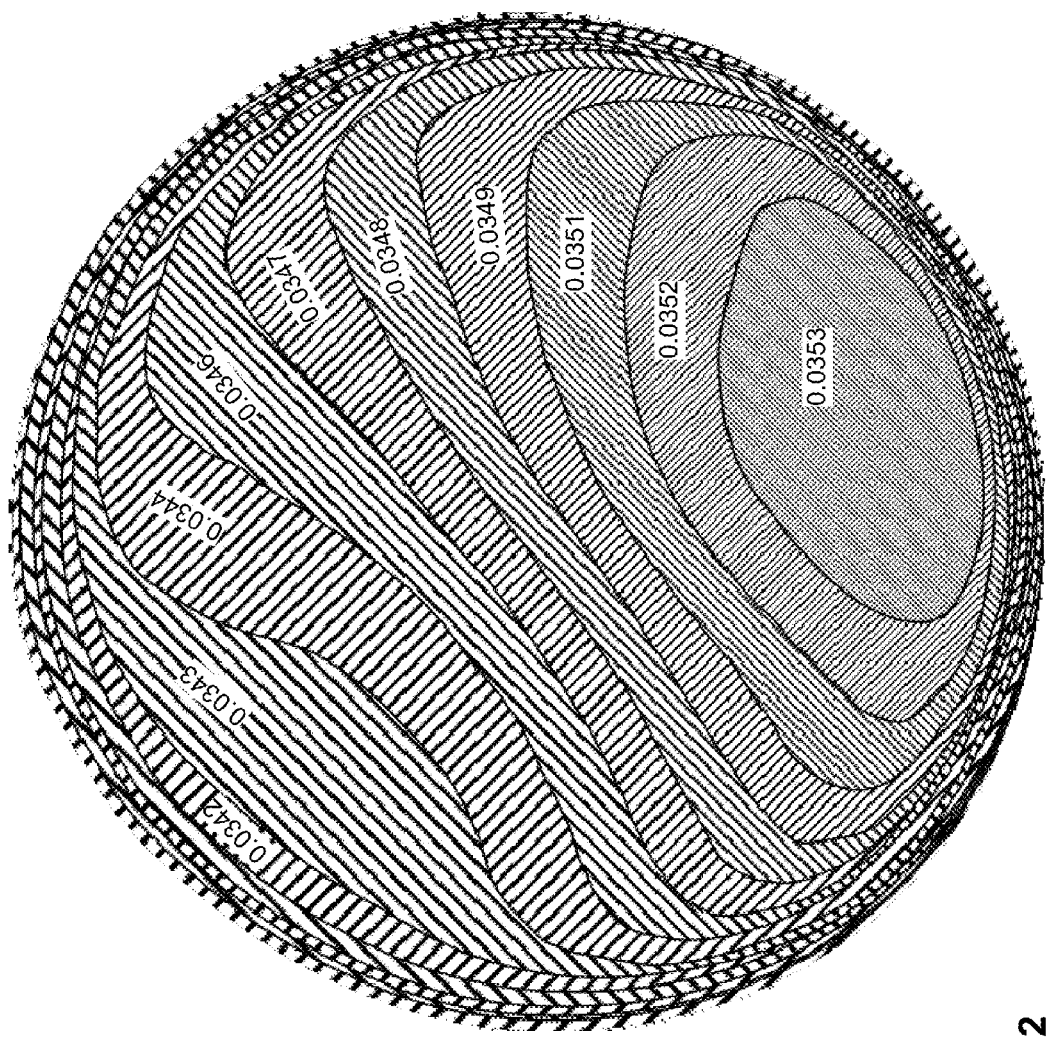
FIG. 2 is a contour plot showing the estimated mass fraction of a process gas on the wafer resulting from a simulated deposition operation using the example gas distribution system of FIG. 1.

The present inventors determined that the azimuthally-non-uniform gas distribution within the stem tube 104 would cause significant non-uniformities in layer thickness on a wafer processed using the gas distribution system depicted in FIG. 1. FIG. 2 is a contour plot showing the estimated mass fraction of a process gas on the wafer resulting from a simulated deposition operation using the example gas distribution system of FIG. 1. In this analysis, mass fraction of reactant that is delivered to various locations on the wafer is viewed as representative of deposition layer thickness—thus, if the mass fraction of reactant that is delivered across the wafer stays relatively uniform, the deposition layer thickness should also have similar uniformity. As can be seen, the simulation indicates that the delivered reactant mass fractions, and thus thickness of the deposited layer, vary considerably both radially and circumferentially. The non-uniformity is at a maximum in a region that is approximately 80° from the clockwise from the direction that the gas flows into the stem feed inlet 154 (the gas flows into the stem feed inlet 154 from left to right in this Figure).

As discussed, the present inventors determined that not only was there radial non-uniformity in the simulated layer deposition, but there was also circumferential non-uniformity present. FIG. 3 is a plot showing the estimated mass fraction of process gas delivered to the wafer measured around the wafer at three different diameters resulting from a simulated deposition operation using the example gas distribution system of FIG. 1. In FIG. 3, each series of data points represents a series of points sampled along different diameter circles on the wafer; the y-axis represents the estimated mass fraction (and thus, implicitly, the layer thickness) of the deposition reactant at each data point. If all of the points along a circle of a given diameter have the same mass fraction, then the wafer should have perfect circumferential uniformity at that diameter. As can be seen, this is not the case for the simulated deposition operation depicted in FIG. 3. There is considerable variation in deposited mass fraction around the circumference of the wafer at 100 mm, 196 mm, and 294 mm diameters (the wafer in question is a 300 mm wafer).

The present inventors have realized that introducing process gases into the stem tube in a particular manner may provide significant improvements in wafer uniformity over the gas distribution system discussed above. The present inventors have thus conceived of an "azimuthal mixer" component that may be plumbed in-line with the stem tube to provide improved azimuthal mixing of the process gases that are introduced into the stem tube prior to such gases being introduced into the showerhead plenum.

The azimuthal mixer component may be particularly well-suited to providing for rapid, uniform gas distribution within a showerhead stem that is free of internal structures at the point where the gases to be mixed are combined. In other words, the azimuthal mixer component may be particularly well-suited to situations where there are no baffles, coaxial feed tubes, or other objects that may alter gas flow within the main passage of the azimuthal mixer (if coaxial feeds are desired, they may be implemented after the azimuthal mixer, as shown in the implementation depicted in FIGS. 10A through 10D).

FIG. 4A is an isometric view of an example gas distribution system for a semiconductor processing apparatus featuring an azimuthal mixer. Many of the components shown in FIG. 4A are similar to components previously described with respect to FIG. 1, and are referred to herein by reference numbers having the same last two digits. These components, such as the showerhead 406 and couplers 410, are not described again in the interest of brevity, and the reader is directed to previous discussion of such components for further details regarding such items.

Of note in FIG. 4A is the presence of manifold block 402, which has replaced a segment of the stem tube 404. The manifold block 402 incorporates an azimuthal mixer within, which is discussed in further detail below. It is to be understood that the term "azimuthal," as used herein, refers to directions that are generally perpendicular to the direction of flow of gases flowing through the stem tube (with respect to the local direction of flow of such gases at the point where mixing occurs).

Figure 4B:
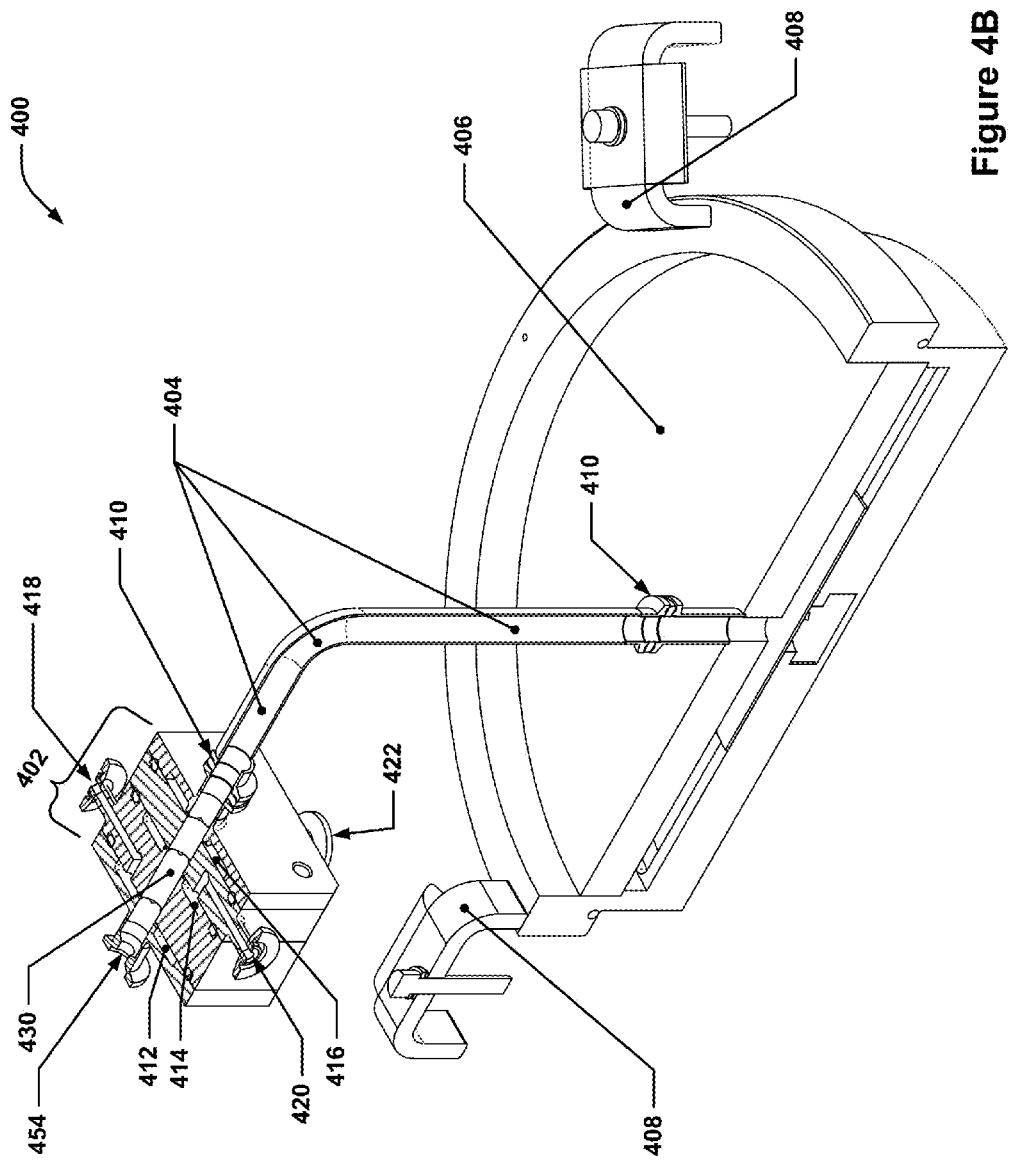
FIG. 4B is an isometric cutaway view of the example gas distribution system of FIG. 4A.

FIG. 4B is an isometric cutaway view of the example gas distribution system of FIG. 4A. As can be seen, the manifold block 402 includes a first inlet 418, a second inlet 420, a third inlet 422, and a stem feed inlet 454. A main passage 430 runs through the manifold block 402; the main passage 430 spans between the stem feed inlet 454 and a port on the exterior of the manifold block 402 that is mated with the stem tube 404. The main passage 430 is substantially coaxial with the linear portion of the stem tube 404 to which it mates, e.g., the main passage and the linear portion of the stem tube 404 may be coaxial with one another to the extent that the tolerances of the fittings used to connect the stem tube 404 to the manifold block 402 allow. Each of the first inlet 418, the second inlet 420, the third inlet 422 is fluidically connected with a first plenum 412, a second plenum 414, and a third plenum 416, respectively. The term "fluidically connected" is used herein to indicate that the connection in question is such that fluids may flow between the items thus connected, e.g., such items are also "fluidly connected."

FIG. 4C is an exploded isometric view of the manifold block incorporating an azimuthal mixer of FIGS. 4A and 4B. FIG. 4C' is an unexploded isometric view of the manifold block of FIG. 4C. FIG. 4D is an exploded reverse isometric view of the manifold block of FIG. 4C. FIG. 4D' is an unexploded isometric view of the manifold block of FIG. 4D.

As can be seen, the manifold block is composed of a number of blocks that are stacked together; the blocks may include various fluid-flow passages, o-ring grooves, plenums, etc. and may be fastened together using fasteners 452. It is to be understood that the azimuthal mixing structures embodied in the manifold block depicted may also be provided using other configurations of parts, e.g., blocks that are welded or brazed together, components that are produced using injection molding or casting, etc. Such alternative implementations are also considered to be within the scope of this disclosure.

In FIG. 4C, there are four blocks: a first block 432, a second block 434, a third block 436, and a fourth block 438. Each of the first through fourth blocks 432, 434, 436, and 438, respectively, have bores through them that, when the blocks are stacked together, line up to form the main passage 430.

The first block 432 and the fourth block 438, in this implementation, also have flanged tube stems (for the first block 432, this flanged tube stem serves as the stem feed inlet 454) that extend the main passage 430 outside of the manifold block for coupling to other components, such as a stem tube 404 (as shown in FIG. 4A) or a gas source (not shown). Of course, other coupling arrangements may also be used in place of such flanged tubes as is needed (for example, a female threaded hole may be provided to allow a male threaded fitting to be used).

Each interface between the first through fourth blocks 432, 434, 436, and 438, respectively, may be sealed using a seal 428, which may be an o-ring or other suitable sealing device. Some or all of the first through fourth blocks 432, 434, 436, and 438, respectively, may have annular channels that encircle the main passage 430 bore; these annular channels may, when the blocks are assembled, form the first plenum 412, the second plenum 414, and the third plenum 416. In some implementations, one or more of the plenums may not completely encircle the main passage, e.g., the plenums may have a C-shape, or may be partitioned into multiple, smaller plenums. In such implementations, the plenum or plenums may substantially encircle the main passage, e.g., may extend, in total, around a majority of circumference of the main passage, may extend, in total, around more than 60%, 70%, 80%, or 90% of the circumference of the main passage.

The second block 434 and the third block 436, in this example, include the first inlet 418 (in the second block 434) and the second inlet 420 and the third inlet 422 (in the third block 436). Each of these inlets may be provided by a hole that is drilled in a direction perpendicular to the center axis of the main passage to a depth that is between the seals 428 and the main passage 430. A feed-through hole that is drilled in a direction parallel to the main passage may then connect each inlet with its corresponding plenum. For example, the first feed-through 440 may fluidically connect the first plenum 412 with the first inlet 418, the second feed-through 442 may fluidically connect the second plenum 414 with the second inlet 420, and the third feed-through 444 may fluidically connect the third plenum 416 with the third inlet 422.

Each of the first plenum 412, the second plenum 414, and the third plenum 416 may be fluidically connected with the main passage 430 by a plurality of radial passages. For example, the first plenum 412 may be fluidically connected with the main passage 430 by a plurality of first radial passages 446, the second plenum 414 may be fluidically connected with the main passage 430 by a plurality of second radial passages 448, and the third plenum 416 may be fluidically connected with the main passage 430 by a plurality of third radial passages 450. Each plenum, in this example, is fluidically connected with the main passage by 8 radial passages.

It is to be understood that while the present example depicts 8 radial passages for each plenum, a larger or smaller number of radial passages may be used. In general, the more radial passages are used to fluidically connect a particular plenum with the main passage, the more rapidly the gases within the main passage will reach a uniform distribution. However, various practical considerations may limit the maximum number of radial passages that may be used. For example, it may be advantageous to limit the total cross-sectional area of the radial passages for a given plenum (measured, with respect to each radial passage, on a plane that is normal to the radius along which the radial passage travels, i.e., nominally normal to the direction of fluid flow within the radial passage) to one tenth of the total cross-sectional area of the corresponding plenum (measured with respect to a plane that intersects with and is parallel to the center axis, or an equivalent thereof, of the main passage;

this total cross-sectional area may include portions of the plenum that lie on either side of the main passage). Maintaining such a geometric relationship may promote uniform gas flow from radial passage to radial passage within the plenum. In order to maintain the total cross-sectional area of the radial passages at a low enough level to maintain this ratio, it may be necessary to limit the number of radial passages. One could, of course, also decrease the size of the radial passages (thus decreasing the cross-sectional area thereof), but this may present issues from a flow restriction perspective and may also be challenging to machine accurately. The number of radial passages associated with each plenum may be 4 or more; 2-passage arrangements are not likely to produce acceptable uniformity results, and 3-passage arrangements are thought to be marginal.

In the implementation shown, the radial flow passages all have a semi-circular cross section, although other cross-sectional shapes may also be used, including circular, rectangular, triangular, etc. In some of these alternative implementations, it may be necessary to form the radial passages using features located in two adjacent blocks, e.g., semicircular cross-section radial passages located on mating blocks may be aligned with one another to form a circular radial passage when the blocks are assembled. Similarly, while the plenums in this implementation are formed by an annular channel in the face of one block and the flat face of another block that mates up to the face with the annular channel, other implementations may feature plenums formed by two annular channels in opposing faces of two mating blocks, or by other structures that may provide the desired flow paths.

In the implementation shown, all of the radial passages have the same cross-sectional area and length, and the radial passages for each plenum are equally spaced or substantially equally spaced, e.g., deviating from equally-spaced locations by ±10%, about the main passage. In other implementations, however, the radial passages for each plenum may differ in cross-sectional shape/size, length, etc. In some implementations, equal spacing between the radial passages for a given plenum may not be used, although such radial asymmetry may adversely impact the mixing performance of an azimuthal mixer.

Generally speaking, the radial passages associated with a particular plenum will all be located at the same axial location with respect to the main passage, i.e., the radial passages for a particular plenum will generally not be staggered along the axial length of the main passage. Thus, gas introduced from the radial passages for a particular plenum will flow into the main passage from a plurality of circumferentially-located openings at the same axial location of the main passage and have substantially the same flow path lengths/mixing lengths within the main passage.

To give some sense of scale, various dimensional values for the implementation depicted in FIGS. 4A through 4D are provided. The overall dimensions of the manifold block (minus the flanged stems) is 4" square by 2.8" deep. The inlet diameters of the first through third inlets 418, 420, and 422, respectively, are approximately 0.18", whereas the main passage diameter is ~0.6". The radii of the radial passages are 0.05" (each set of 8 radial passages thus has a total cross-sectional area of ~0.03 in$^2$), and the plenum volume has a cross-sectional area of approximately 0.3 in$^2$.

The manifold block of FIGS. 4A through 4D may be placed in a variety of locations with good efficacy. FIG. 5A is a schematic of one potential placement of a manifold block relative to a showerhead and stem tube. FIG. 5B is a schematic of another potential placement of a manifold block relative to a showerhead and stem tube.

As can be seen, in these particular implementations, the stem tube 504 experiences a 90-degree bend approximately midway along its length. This is because this particular stem tube 504 is designed to be used in a multi-station semiconductor processing tool that includes a square cluster of four showerheads that are all supplied at least one process gases from a manifold located at the center of the cluster. Thus, each stem tube 504 first travels out from the center manifold in a radial direction before turning 90 degrees and travelling down to the center of its respective showerhead 506 to supply gas to the showerhead plenum 526. Of course, other stem tube designs may be used as well, including straight stem tubes, single-station stem tubes, etc.

As can be seen, FIG. 5A depicts an arrangement in which the manifold block 502 is located "downstream" of the 90-degree bend in the depicted stem tube 504, i.e., between the showerhead 506 and the 90-degree bend. The dotted rectangular area within the manifold block 502 represents the approximate region within which gases are introduced into the main passage via the radial passages; as can be seen, this leaves a shorter mixing length 562 than is provided by the configuration of FIG. 5B, where the manifold block 502 is upstream of the 90-degree bend. However, the efficacy of the manifold block in providing uniform gas distribution within the stem tube 504 is high enough that either location appears to provide acceptable deposition uniformity in the process that the present inventors modeled. If more uniform mixing is desired, it may be necessary to increase the mixing length 562 by moving the manifold block to a more upstream location, as shown in FIG. 5B.

FIG. 5C is a schematic of a potential placement of another example manifold block relative to a showerhead and stem tube. In this implementation, which is based on a different design of manifold block that is discussed in more detail later in this disclosure (see FIGS. 10A through 10D, the manifold block 502 may be connected directly to the showerhead 506. This may, of course, place a constraint on the mixing length 562, although alternative designs may be used to increase the mixing length, e.g., by incorporating the 90-degree bend into the manifold block 502 itself.

As discussed above, simulations of gas distribution systems using the manifold block discussed above indicated a drastic improvement in wafer deposition uniformity. FIG. 6 is a plot showing the estimated mass fraction of a process gas on a wafer at three different diameters resulting from a simulated deposition operation using the manifold block of FIGS. 4C through 4D placed at a location such as that depicted in FIG. 5B.

As can be seen, there is near-perfect circumferential uniformity in the simulated process gas mass fraction across the wafer, and thus, implicitly, the wafer deposition layer thickness, at both the 100 mm and 196 mm diameters, which is a drastic improvement over the circumferential non-uniformity evident in the simulation run without the use of an azimuthal mixer (see FIG. 3). There is still, however, circumferential non-uniformity evident at the 294 mm diameter, which is very close to the wafer edge (the wafer is 300 mm in diameter). This is not unexpected, as edge effects can cause such non-uniformities. The fact that the majority of the wafer experiences near-perfect mass fraction uniformity indicates strongly that the edge-located non-uniformity is due to some other factor besides gas distribution non-uniformity within the stem tube.

FIG. 7 is a contour plot showing the mass fraction of process gas delivered to the wafer resulting from a simulated deposition operation using the manifold block of FIGS. 4C through 4D placed at a location such as that depicted in FIG.

5B. As can be seen, nearly 75% of the surface area of the wafer falls within a near-constant mass fraction contour, which is a marked improvement when compared against the non-uniformities evident in FIG. 2.

FIG. 8 is a plot showing the mass fraction of process gas delivered to the wafer at three different diameters resulting from a simulated deposition operation using the manifold block of FIGS. 4C through 4D placed at a location such as that depicted in FIG. 5A. As can be seen, the 100 mm and the 196 mm diameters again exhibit near-perfect circumferential uniformity, even when the manifold block is placed in a downstream location closer to the showerhead.

In addition to improving mass fraction uniformity across the wafer during deposition gas delivery, the use of an azimuthal mixer can also reduce purge time, thus allowing for an increase in process throughput. FIG. 9 is a plot showing improvements in purge time using an azimuthal mixer as discussed herein in comparison to a stem tube arrangement without an azimuthal mixer. As can be seen, with the azimuthal mixer (black lines), the time to purge to less than 0.001 reactant mass fraction at the wafer is ~1.75 seconds, whereas without the azimuthal mixer, the time to purge to the same level is ~2.7 seconds—the use of an azimuthal mixer thus results in a 35% decrease in purge time at this mass fraction level. If the mass fraction at the wafer is reduced to a level below 0.0001, the use of the azimuthal mixer may require a purge time of ~2.5 seconds, whereas without the use of the azimuthal mixer, the purge time may be ~4 seconds. This represents a significant improvement in purge time, and may greatly enhance process throughput, especially in processes where large numbers of purge cycles are performed (such as in atomic layer deposition processes).

While the above discussion has focused on an azimuthal mixer that has three inlets (with corresponding plenums and radial passage arrays) in addition to the stem feed inlet, the number of inlets, plenums, and radial passage arrays that may be incorporated in an azimuthal mixer may be different from the example shown. For example, an azimuthal mixer may have a single plenum, corresponding radial passage array, and inlet (other than the stem feed inlet), or may have any number of such structures as may fit within the packaging constraints governed by the stem tube length of a gas distribution apparatus. Furthermore, each plenum may be fed by one or more inlets (which may supply the same or different process gases), rather than just the single inlet in the above examples.

Figure 10A:
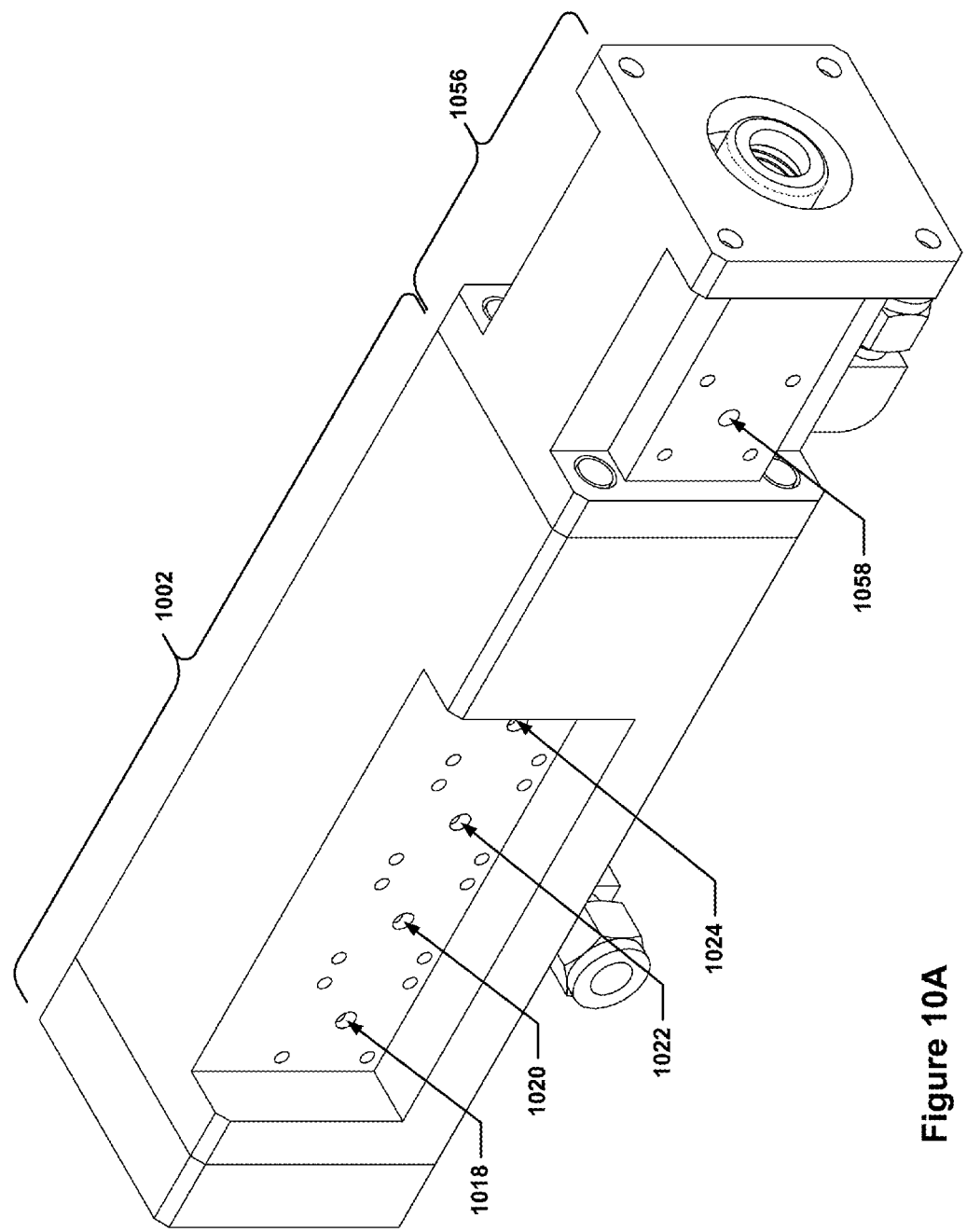
FIG. 10A is an isometric view of an azimuthal mixer with an integrated heating system.
Figure 10C:
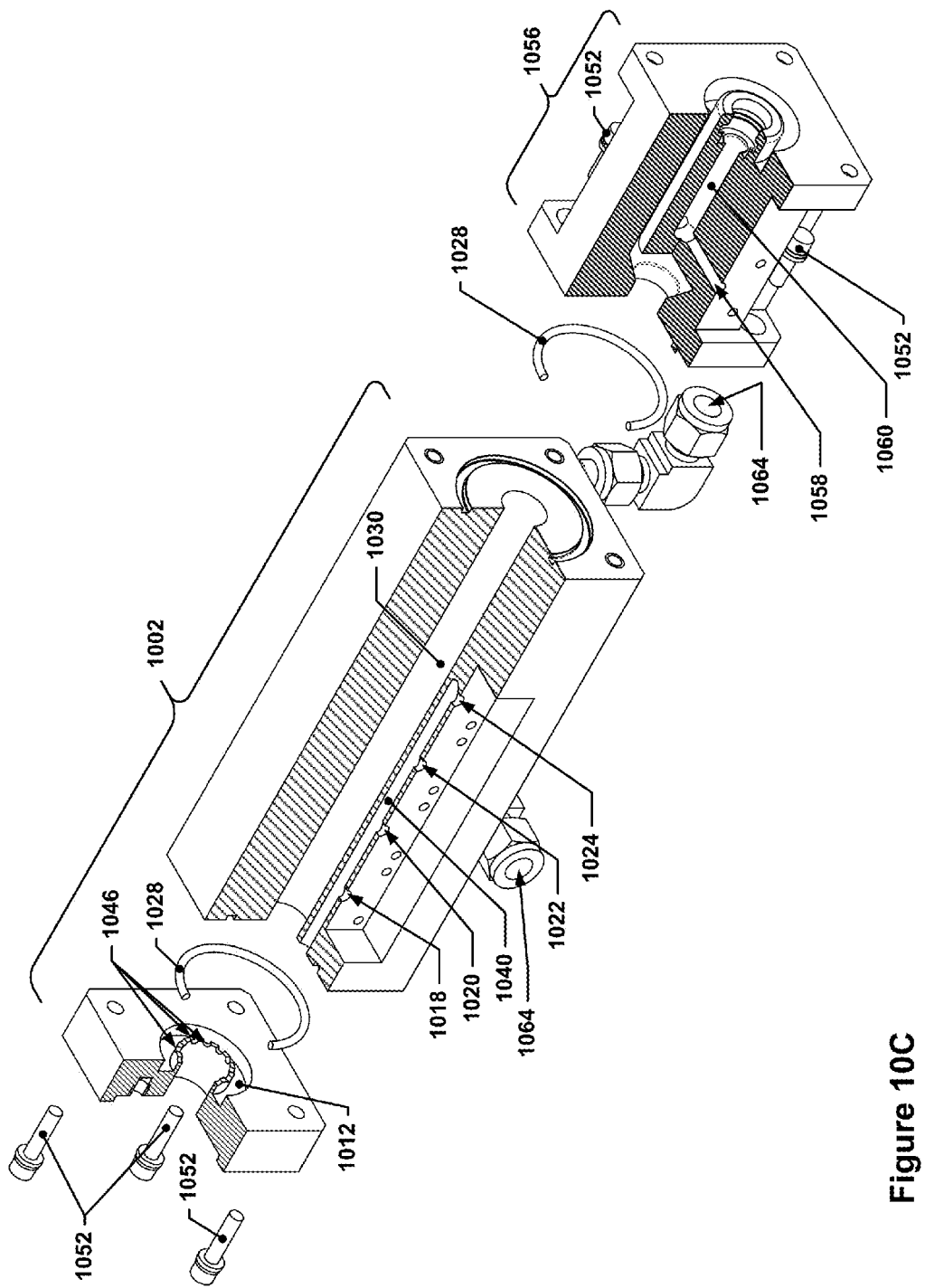
FIG. 10C is an exploded isometric cutaway view of the azimuthal mixer of FIG. 10A.
Figure 10D:
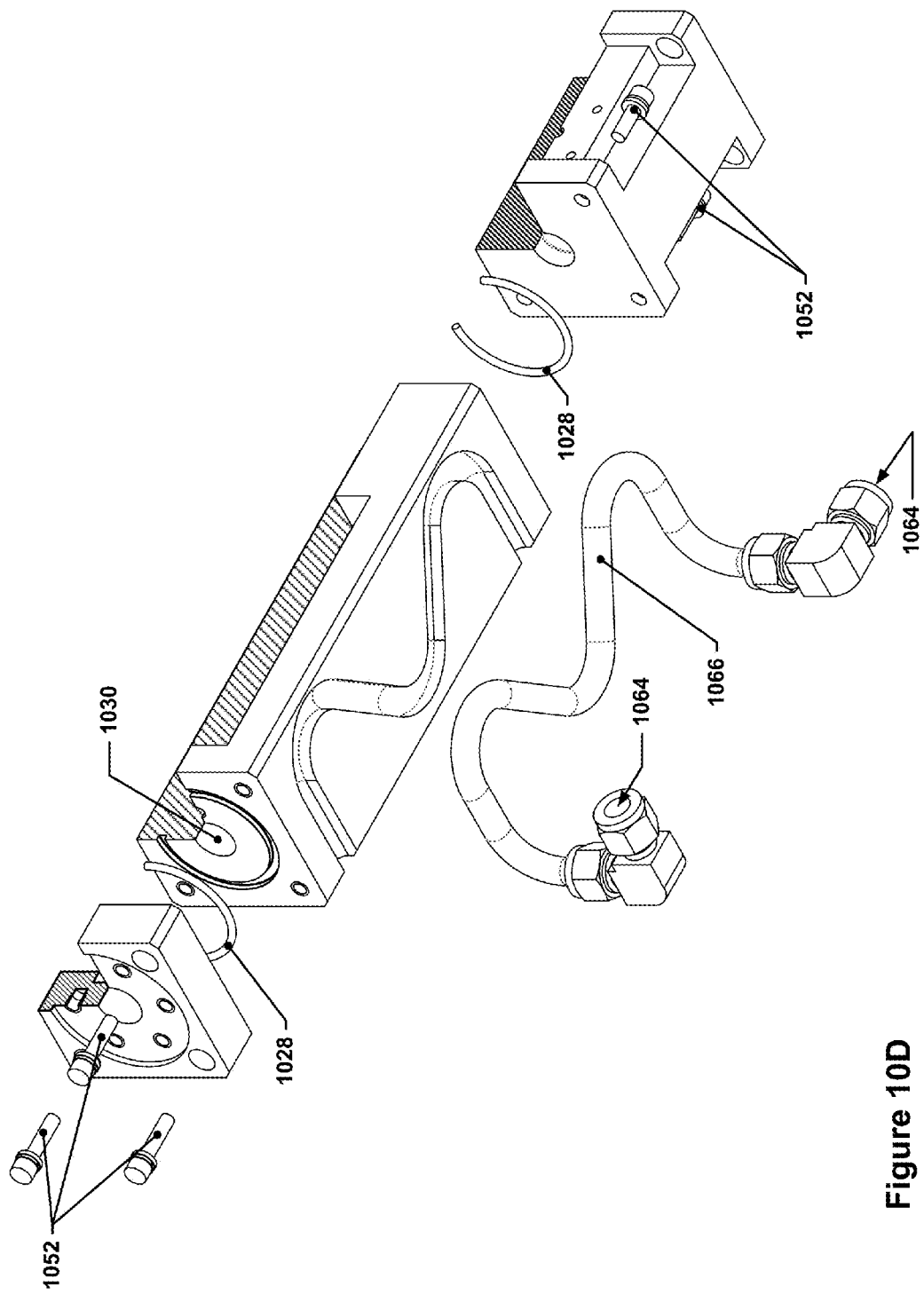
FIG. 10D is an exploded reverse isometric cutaway view of the azimuthal mixer of FIG. 10A.

Such alternate configurations may, for example, allow for a more compact manifold block with increased performance capabilities and enhanced feature sets, such as the incorporation of heating or cooling elements into the manifold block. FIG. 10A is an isometric view of an azimuthal mixer with an integrated heating system. FIG. 10B is an isometric cutaway view of the azimuthal mixer of FIG. 10A. FIG. 10C is an exploded isometric cutaway view of the azimuthal mixer of FIG. 10A. FIG. 10D is an exploded reverse isometric cutaway view of the azimuthal mixer of FIG. 10A.

As can be seen in FIG. 10A, a manifold block 1002 is provided, as well as a coaxial manifold body 1056. The coaxial manifold body 1056, which is optional, may be used to allow a second process gas to be flowed into a showerhead via a coaxial inlet 1058 in parallel with a first process gas that is provided by the manifold block 1002 while maintaining physical isolation between the first and second process gases at least until those process gases are introduced into the showerhead (in some implementations, the showerhead itself may continue to maintain such isolation and the first and second process gases may only be allowed to mix once they are flowed from the showerhead and onto a semiconductor wafer).

The manifold block 1002 is a slightly different design than the manifold block 402 discussed earlier in this disclosure. For example, the manifold block 1002 includes a first inlet 1018, a second inlet 1020, a third inlet 1022, and a fourth inlet 1024. The first inlet 1018, the second inlet 1020, the third inlet 1022, and the fourth inlet 1024 may, as shown, all be located in or on a common face or side of the manifold block 1002 and may be arranged in a linear array (as can be see, each inlet, including the coaxial inlet 1058, is at the center of a square hole pattern—the holes of the square hole pattern may be threaded to allow valve blocks or other gas supply line connection systems to be attached to the manifold block 1002 or the coaxial manifold body 1056).

FIG. 10B depicts further details of the manifold block 1002 and the coaxial manifold body 1056 via a cutaway view. As can be seen, the first inlet 1018, the second inlet 1020, the third inlet 1022, and the fourth inlet 1024 are all fluidically connected with a common first feed-through 1040, which travels parallel to a main passage 1030. The first feed-through 1040 is, in turn, fluidically connected to a first plenum 1012, which is an annular channel that encircles the main passage 1030 (the first plenum 1012 may be increased from the size depicted in order to establish a total cross-sectional area of the first plenum that is at least ten times larger than the total cross-sectional areas of the first radial passages, as discussed earlier, if improved performance is desired). A plurality of first radial passages 1046 fluidically connects the first plenum 1012 with the main passage 1030. Process gases may be flowed through all or some of the first inlet 1018, the second inlet 1020, the third inlet 1022, and the fourth inlet 1024 (as shown by the white arrows), up through the first feed-through 1040, into the first plenum 1012, and then through the first radial passages 1046 and into the main passage 1030, where the gases provided by the first inlet 1018, the second inlet 1020, the third inlet 1022, and/or the fourth inlet 1024 may mix with gases (grey arrows) introduced via a stem feed inlet 1054. The mixed gases may flow along the length of the main passage 1030 in the direction shown until they exit the manifold block 1002. If a coaxial manifold body is attached to the exit of the manifold block 1002, then the mixed gases may flow into a gap around a coaxially-located coaxial passage 1060 before exiting the coaxial manifold body.

Of note is the fact that this implementation features a single plenum and a single set of radial passages, but has multiple inlets (in addition to the stem feed inlet 1054) that all feed into the single plenum via a single feed-through passage. Alternate configurations may involve multiple inlets that feed into a single plenum via multiple feed-through passages. Regardless of how the gases provided to the various inlets (other than the stem feed inlet 1054) reach the main passage, they must still all ultimately flow through a set of radial passages that link a plenum with the main passage. This circumferential delivery of gases into the main passage appears to promote rapid, uniform mixing of the gases within the main passage.

FIG. 10B' depicts a schematic cross-section of the coaxial manifold body 1056 in a plane that intersects the coaxial inlet 1058 and is perpendicular to the center axis of the coaxial passage 1060. FIG. 10B' is not to-scale, and may omit certain features shown in FIG. 10B. As can be seen, however, the mixed gas from the manifold block 1002 may flow through the arc-shaped passages that surround the coaxial passage 1060. The coaxial inlet 1058 may pass through one or both of the support columns that support material in which the coaxial passage 1060 is located.

Because of the way that the manifold block 1002 is constructed, three of the four long sides of the manifold block 1002 are relatively flat and uncluttered by fittings, inlets, etc. This may allow for easy integration of heating or cooling systems, e.g., resistive heater platens, cooling/heating fluid conduits, etc., to allow the manifold block 1002 to be temperature-controlled. This may assist in preventing condensation of process gases within the manifold block 1002.

In the depicted implementation, a heating fluid passage 1066 is included, as well as heating fluid ports 1064 (one may serve as an inlet, the other as an outlet). The heating fluid passage 1066, in this case, is a tube that is bent into a serpentine shape and then laid into a correspondingly-shaped channel in one side of the manifold block 1002. In other implementations, such a heating fluid passage 1066 may also wend its way across other surfaces of the manifold block 1002, or there may be additional heating fluid passages 1066 that do so. In some implementations, the heating fluid passage(s) 1066 may be an integral part of the manifold block 1002, e.g., a milled channel (much like the serpentine channel shown) in the manifold block 1002 may be covered with a plate having inlet/outlet ports that are located such that the only fluid entrances/exits into the channel are the inlet/outlet ports. A thermocouple or other temperature sensor may be located on, or embedded within, the manifold block 1002 in order to provide some form of feedback regarding temperature to allow a temperature controller to increase or decrease the amount of heating that is provided to the manifold block 1002 by the heating fluid passage 1066 (or other heating system, if used).

To give some sense of scale of the implementation pictures in FIGS. 10A through 10D, the manifold block 1002 shown is approximately 8" in length, and 2.5" square. The axial manifold body is approximately 3.2" in length. The first radial passages 1046 are substantially the same dimensions as those discussed earlier with respect to the manifold block 402, although the first plenum 1012 is a smaller cross section at approximately 0.2" to 0.25" square.

Various different configurations of plenums and radial passages may be suitable for practicing the azimuthal mixing concepts discussed herein. Included in, but not limited to, these configurations are various configurations depicted in FIGS. 11A through 11I. FIGS. 11A through 11I depict cross-sections through various different configurations of plenums, radial passages, and main passages. All of FIGS. 11A through 11I use the same convention with regard to cross-hatching of components per the legend included on the right side of the sheet having FIGS. 11A through 11I.

FIG. 11A depicts a cross-section of an azimuthal mixer concept in which a manifold block 1102 has a first plenum 1112 that encircles a main passage 1130. A first inlet 1118 extends into the manifold block 1102 deep enough to intersect with a first feed-through 1140, which leads to the first plenum 1112. Process gases that are introduced into the first plenum 1112 are directed radially inwards through a plurality of first radial passages 1146 and into the main passage 1130. This concept is quite similar to the basic layout of the azimuthal mixers discussed in the above examples.

FIG. 11B depicts a cross-section of an azimuthal mixer concept in which there are two first inlets 1118 and two first feed-throughs 1140, both of which deliver gas to the same first plenum 1112. This implementation, aside from these differences, operates in a similar manner to the implementation of FIG. 11A.

FIG. 11C depicts a cross-section of an azimuthal mixer concept in which the first inlet 1118 leads directly to the first plenum 1112 without the use of a first feed-through 1140. This implementation, aside from these differences, operates in a similar manner to the implementation of FIG. 11A.

FIG. 11D depicts a cross-section of an azimuthal mixer concept in which the first inlet 1118 leads directly to the first plenum 1112 without the use of a first feed-through 1140, much like the implementation of FIG. 11C. However, this implementation also includes a baffle wall 1170 in between the first inlet 1118 and the first radial passages 1146; this may prevent or mitigate a pressure imbalance on the radial passages caused by the injection of process gas into the plenum in a direction that favors some radial holes over others. This implementation, aside from these differences, operates in a similar manner to the implementation of FIG. 11C.

FIG. 11E depicts a cross-section of an azimuthal mixer concept in which the first plenum 1112 does not completely encircle the main passage 1130. This implementation, aside from these differences, operates in a similar manner to the implementation of FIG. 11A.

FIG. 11F depicts a cross-section of an azimuthal mixer concept in which the first plenum 1112 is split into two separate sub-plenums, each fed by a separate first feed-through. This implementation, aside from these differences, operates in a similar manner to the implementation of FIG. 11E.

FIG. 11G depicts a cross-section of an azimuthal mixer concept in which the first inlet provides process gas to two separate first feed-throughs 1140, each of which provides process gas to a separate sub-plenum of first plenum 1112 This implementation, aside from these differences, operates in a similar manner to the implementation of FIG. 11F.

FIG. 11H depicts a cross-section of an azimuthal mixer concept in which the first radial passages 1146 do not actually follow a radial path, but are slanted with respect to a radial path. This implementation, aside from these differences, operates in a similar manner to the implementation of FIG. 11A.

FIG. 11I depicts a cross-section of an azimuthal mixer concept in which the first radial passages 1146 are not linear, but are curved and also bifurcate prior to reaching the main passage 1130. This implementation, aside from these differences, operates in a similar manner to the implementation of FIG. 11A (the number of first radial passages 1146 is also less—although the six first radial passages 1146 shown split into 12 first radial passages before reaching the main passage 1130).

Features from the various concepts shown in FIGS. 11A through 11I may be intermixed with one another as desired. As can be seen, the first plenum in each of FIGS. 11A through 11I substantially encircles the main passage, even though, in some cases, the first plenum may not extend around the entirety of the main passage, e.g., it may have a C-shape or be formed by multiple discrete sections.

While not show in any of the preceding Figures, the showerheads, stem tubes, and manifold blocks described herein may be incorporated in any semiconductor manufacturing equipment that has a gas distribution system. Such equipment may include a single station or multiple stations that have such gas distribution systems. A manifold block may have a number of valves mounted to it (or connected to it) to provide process gases to the various inlets; such valves may be connected with a controller that may control when and how long each valve is opened. Such a controller may also be connected with any heating or cooling system that is part of the manifold block, as well as with any temperature or other sensors that may be used to provide feedback to the controller. Such a controller may include one or more processors and a memory that stores instructions for controlling the valves, the heating (or cooling) elements (if used), and any other related equipment in order to provide a desired combination of process gases for a given semiconductor process. The instructions may include, for example, instructions to control the heating (or cooling) elements to maintain a desired manifold block temperature (such temperatures may be monitored through the use of thermocouples or other temperature sensors that may be used to obtain feedback regarding the estimated manifold block temperature), as well as instructions to control the supply of process gases to the manifold block. As discussed above, the controller may typically include one or more memory devices and one or more processors configured to execute the instructions such that the apparatus will provide process gases as needed for a given semiconductor manufacturing process. Machine-readable media containing instructions for controlling process operations in accordance with the present disclosure may be coupled to the system controller.

Figure 12:
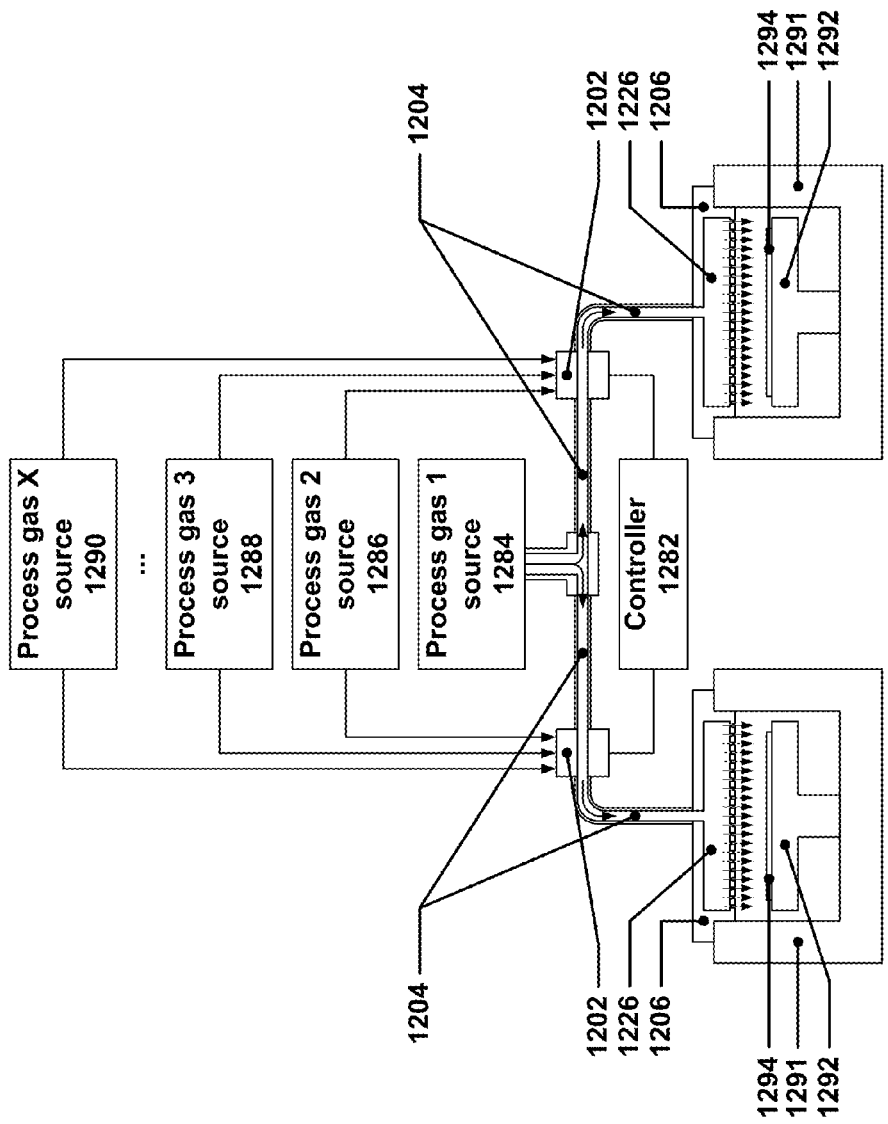
FIG. 12 depicts a high-level diagram of a multi-station semiconductor processing tool.

FIG. 12 depicts a high-level diagram of a multi-station semiconductor processing tool. The depicted semiconductor processing tool includes at least two semiconductor processing chambers 1291, each of which has a showerhead 1206. Each semiconductor processing chamber 1291 also includes a wafer support or pedestal 1292 which may support a wafer 1294 within the semiconductor processing chamber 1291 during wafer processing operations. Process gases are delivered to a showerhead plenum 1226 of each showerhead 1206 by a stem tube 1204. Each stem tube 1204 has a manifold block 1202 incorporating an azimuthal mixer, as described herein, plumbed in-line. The manifold blocks may each have inlets that are connected with one or more process gas sources, such as process gas sources 1286, 1288, and 1290. The stem tubes 1204 may be connected with a first gas source 1284 that may deliver process gas(es) to the main passage of each manifold block 1202. A controller 1282 may be communicatively connected with valves or other gas flow control devices, e.g., such as may be attached to the manifold block 1202.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. An apparatus for supplying process gases to a semiconductor processing gas distribution system, the apparatus comprising:
a main passage;
a first plenum that substantially encircles the main passage;
a first inlet, the first inlet fluidically connected to the first plenum;
a manifold block including a first block and a second block; and
a plurality of first radial passages, each first radial passage spanning between, and fluidically connecting, the main passage with the first plenum, wherein:
the first block and the second block are adjacent to one another,
the first radial passages are defined by opposing surfaces of the first block and the second block,
the first plenum is defined by opposing surfaces of the first block and the second block, and
a first feed-through fluidically connects the first inlet with the first plenum.

2. The apparatus of claim 1, wherein the first plenum is annular and the main passage is coaxial with a center axis of the first plenum.

3. The apparatus of claim 1, wherein there are three first radial passages.

4. The apparatus of claim 1, wherein there are four or more first radial passages.

5. The apparatus of claim 1, wherein the plurality of first radial passages are distributed around the main passage in a substantially equally-spaced manner.

6. The apparatus of claim 1, further comprising:
a gas distribution showerhead; and
a stem tube, wherein:
the manifold block includes the main passage, the first plenum, the first inlet, and the plurality of first radial passages, and
the stem tube is interposed between the manifold block and the gas distribution showerhead.

7. The apparatus of claim 1, further comprising:
a gas distribution showerhead; and
a stem tube, wherein:
the manifold block includes the main passage, the first plenum, the first inlet, and the plurality of first radial passages, and
the stem tube:
includes a first portion and a second portion,
the manifold block is located between the first portion and the second portion,
a first end of the first portion is mated and fluidically connected with a first end of the main passage, and
a first end of the second portion is mated and fluidically connected with a second end of the main passage opposite the first end of the main passage and a second end of the second portion is configured to be connected with a gas distribution showerhead.

8. The apparatus of claim 7, wherein:
the first portion includes a 90-degree bend, and
the main passage and the second portion are substantially coaxial with one another.

9. The apparatus of claim 7, wherein:
the second portion includes a 90-degree bend, and
the main passage and the first portion are substantially coaxial with one another.

10. The apparatus of claim 1, further comprising:
a second plenum that substantially encircles the main passage;
a second inlet, the second inlet fluidically connected to the second plenum; and
a plurality of second radial passages, each second radial passage spanning between, and fluidically connecting, the main passage with the second plenum.

11. The apparatus of claim 10, further comprising:
a third plenum that substantially encircles the main passage;
a third inlet, the third inlet fluidically connected to the third plenum; and
a plurality of third radial passages, each third radial passage spanning between, and fluidically connecting, the main passage with the third plenum.

12. The apparatus of claim 1, wherein:
the sum of the cross-sectional areas of the first radial passages is less than one tenth the total cross-sectional area of the first plenum,
the cross-sectional area of each first radial passage is evaluated with respect to a plane that is normal to the radial direction along which that first radial passage travels, and
the total cross-sectional area of the first plenum is evaluated with respect to a plane that intersects, and is parallel to, a center axis of the main passage and includes portions of the first plenum on both sides of the main passage.

13. The apparatus of claim 1, further comprising one or more additional inlets, each additional inlet fluidically connected with the first feed-through prior to the first feed-through reaching the first plenum.

14. The apparatus of claim 13, wherein:
the first inlet and the one or more additional inlets are arranged in a line parallel to the main passage, and
the first feed-through is parallel to the main passage.

15. The apparatus of claim 14, wherein the first inlet and the one or more additional inlets are located between the first plenum and an end of the main passage that serves as an outlet from the apparatus when the apparatus is installed as part of the semiconductor processing gas distribution system.

16. The apparatus of claim 14, further comprising:
a heater mechanism in thermal contact with the manifold block along at least one side of the manifold block other than a side of the manifold block where the first inlet and the one or more additional inlets enter the manifold block, wherein the manifold block includes the first plenum, the first feed-through, the first inlets, the one or more additional inlets, and the main passage.

17. The apparatus of claim 16, wherein the heater mechanism includes a serpentine heating fluid flow passage.

18. The apparatus of claim 16, wherein:
the manifold block is approximately 7 to 9 inches in length in a direction parallel to the main passage and 2 to 3 inches square in directions perpendicular to an axis parallel to the main passage, and
the main passage is approximately 0.375" to 0.75" in diameter.

19. The apparatus of claim 12, wherein:
each first radial passage has a cross-sectional area in a plane that is normal to the radial direction along which that first radial passage travels that is between 0.0025 in$^2$ and 0.057 in$^2$, and
the first plenum has a total cross-sectional area with respect to a plane that intersects, and is parallel to, a center axis of the main passage that is between 0.21 in$^2$ and 0.47 in$^2$.

20. The apparatus of claim 14, further comprising:
a coaxial manifold body, the coaxial manifold body including:
a coaxial inlet;
a coaxial passage; and
a main passage extension, wherein:
the coaxial inlet is fluidically connected with the coaxial passage within the coaxial manifold body,
the coaxial inlet and the coaxial passage are fluidically isolated from the main passage extension within the coaxial manifold body, and
the main passage extension is formed, at least in part, by one or more fluid flow volumes that are interposed between the coaxial passage and the outer surfaces of the coaxial manifold body.

21. The apparatus of claim 10, further comprising a second feed-through, wherein the second feed-through fluidically connects the second inlet with the second plenum.

* * * * *